(12) United States Patent
Suzuri et al.

(10) Patent No.: US 7,897,421 B2
(45) Date of Patent: Mar. 1, 2011

(54) ORGANIC ELECTROLUMINESCENT ELEMENT, DISPLAY AND ILLUMINATOR

(75) Inventors: Yoshiyuki Suzuri, Tokyo (JP); Hiroshi Kita, Tokyo (JP)

(73) Assignee: Konica Minolta Holdings, Inc. (JP)

( * ) Notice: Subject to any disclaimer, the term of this patent is extended or adjusted under 35 U.S.C. 154(b) by 0 days.

(21) Appl. No.: 12/335,321

(22) Filed: Dec. 15, 2008

(65) Prior Publication Data

US 2009/0092743 A1 Apr. 9, 2009

Related U.S. Application Data

(63) Continuation of application No. 11/632,758, filed as application No. PCT/JP2005/012889 on Jul. 13, 2005, now Pat. No. 7,504,657.

(30) Foreign Application Priority Data

Jul. 23, 2004 (JP) ............... 2004-215728

(51) Int. Cl.
*H01L 21/00* (2006.01)
(52) U.S. Cl. ............... 438/29; 438/22; 438/99; 257/E21.001
(58) Field of Classification Search .......... 438/99, 438/29; 257/E21.001
See application file for complete search history.

(56) References Cited

U.S. PATENT DOCUMENTS

| 6,411,019 | B1 | 6/2002 | Hofstra et al. |
| 6,687,266 | B1 | 2/2004 | Ma et al. |
| 6,812,497 | B2 | 11/2004 | Kamatani et al. |
| 2002/0027416 | A1 | 3/2002 | Kim et al. |
| 2003/0010288 | A1* | 1/2003 | Yamazaki et al. ............ 118/715 |
| 2004/0033363 | A1* | 2/2004 | Yano et al. ............... 428/411.1 |
| 2005/0249972 | A1* | 11/2005 | Hatwar et al. ............... 428/690 |

FOREIGN PATENT DOCUMENTS

| JP | 2001-313180 | 11/2001 |
| JP | 2002-184574 | 6/2002 |
| JP | 2002-184574 A | 6/2002 |
| JP | 2003-272857 | 9/2003 |
| JP | 2003-272857 A | 9/2003 |

(Continued)

OTHER PUBLICATIONS

International Search Report for International Application No. PCT/JP2005/012889 dated Oct. 18, 2005.
European Search Report for European Patent Application No. 05765803.1—1218 / 1784056 PCT/JP2005012889 dated Mar. 19, 2009.

(Continued)

*Primary Examiner*—Angel Roman
(74) *Attorney, Agent, or Firm*—Cantor Colburn LLP

(57) ABSTRACT

A method of producing an organic electroluminescent element may include forming a transparent electrode as an anode on a transparent substrate; forming a light emission layer on the transparent substrate having thereon the anode; and forming a cathode on the substrate having thereon the anode and the light emission layer. The light emission layer may be formed by a method including arranging at least one vaporization crucible E evaporating a light emission dopant and at least one vaporization crucible I evaporating a host material and an intermediate layer forming material; and moving the substrate having thereon the anode over the vaporization crucibles E and I to form a light emission layer.

7 Claims, 10 Drawing Sheets

FOREIGN PATENT DOCUMENTS

| | | |
|---|---|---|
| JP | 2005-44791 | 2/2005 |
| WO | 02/091814 A2 | 11/2002 |
| WO | 2004/060026 A1 | 7/2004 |

OTHER PUBLICATIONS

European Search Report for Application No. 10152814.9—1218/2178348 mailed on Mar. 26, 2010.

* cited by examiner

FIG. 4
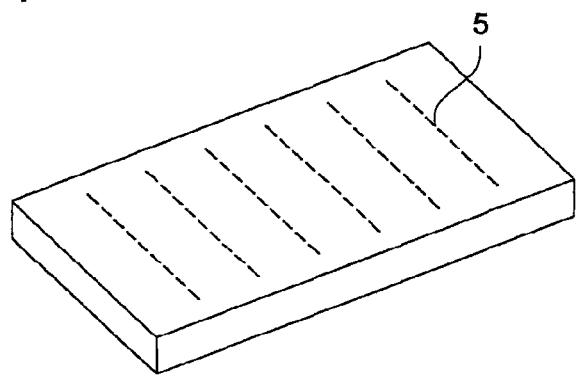
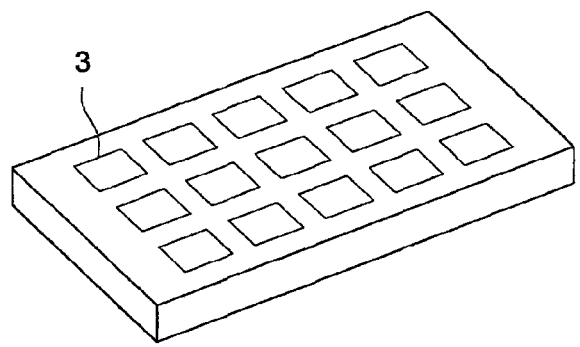
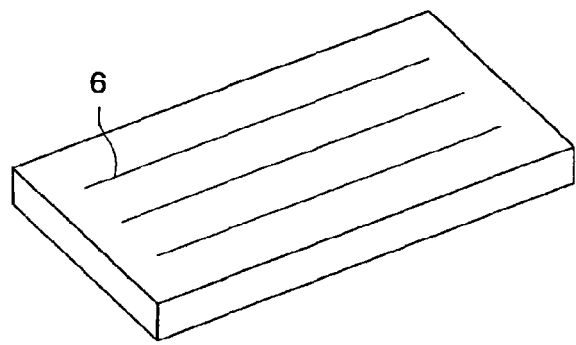
FIG. 5
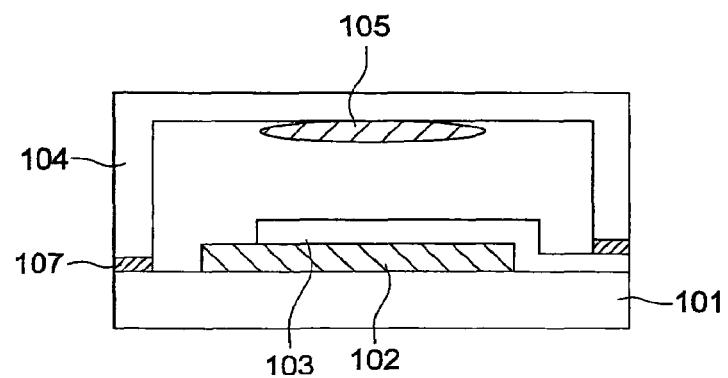

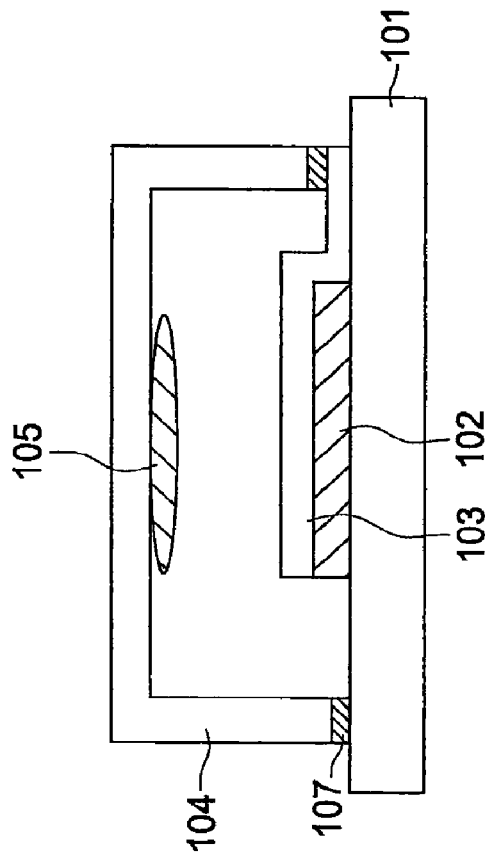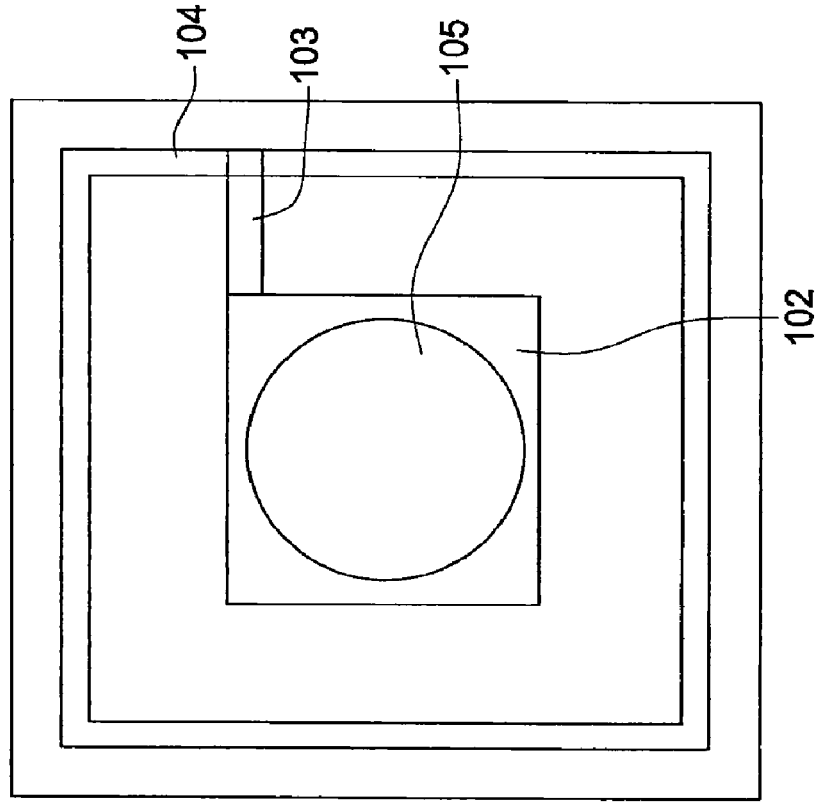

FIG. 9
ELEMENT STRUCTURE
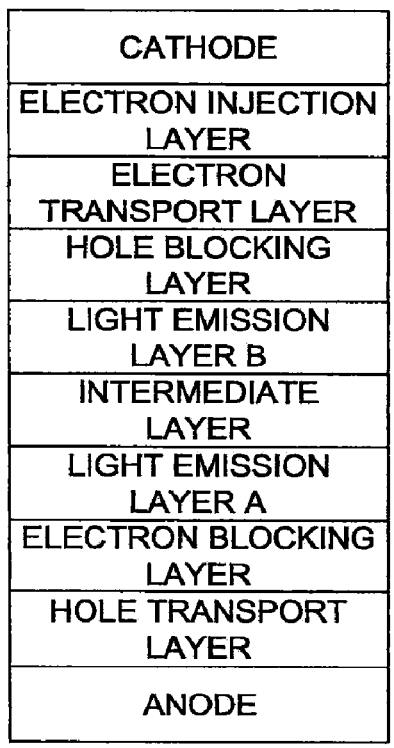
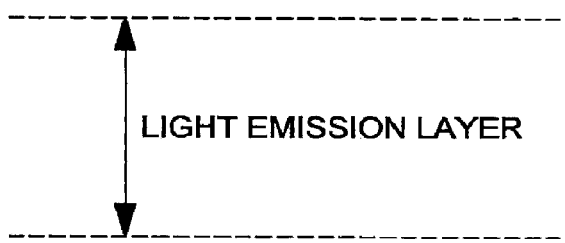
ELEMENT STRUCTURE 1

FIG. 10
LIGHT EMISSION LAYER
(A,B 2 TYPES)
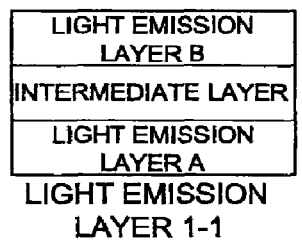
LIGHT EMISSION
LAYER 1-1
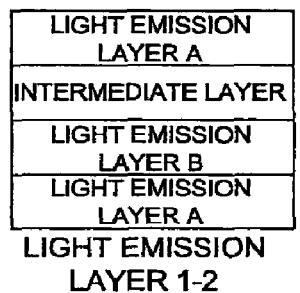
LIGHT EMISSION
LAYER 1-2
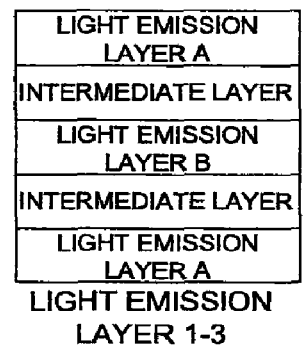
LIGHT EMISSION
LAYER 1-3
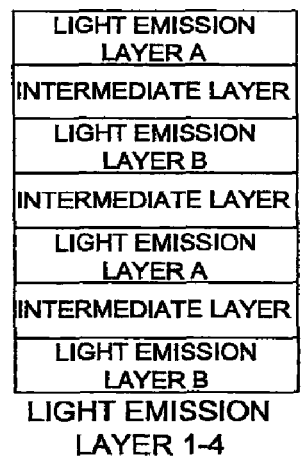
LIGHT EMISSION
LAYER 1-4
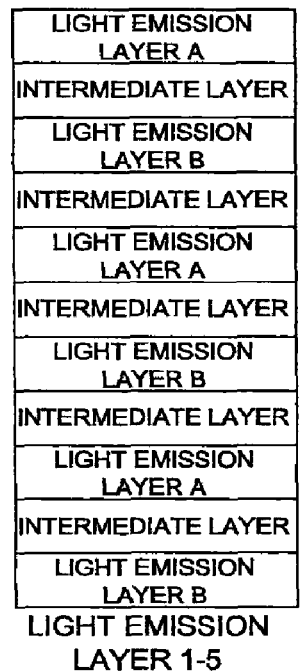
LIGHT EMISSION
LAYER 1-5
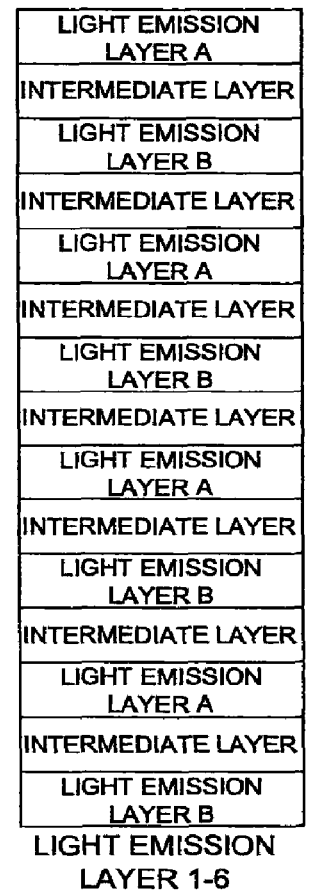
LIGHT EMISSION
LAYER 1-6

FIG. 11
LIGHT EMISSION LAYER
(A,B,C 3 TYPES)
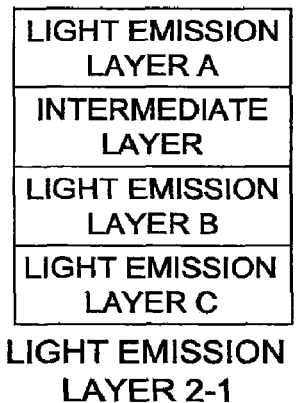
LIGHT EMISSION
LAYER 2-1
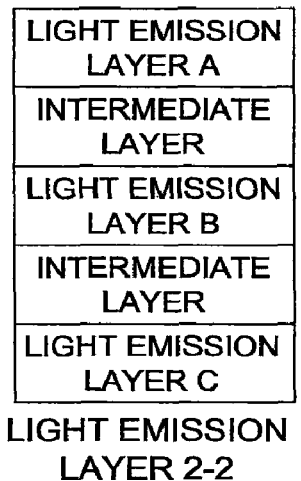
LIGHT EMISSION
LAYER 2-2
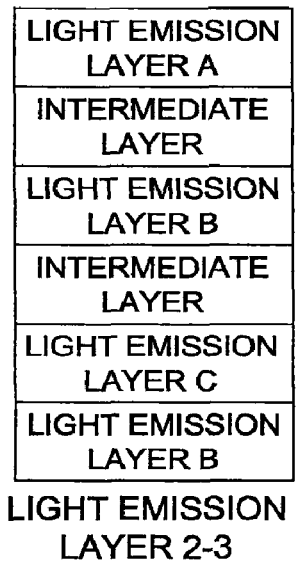
LIGHT EMISSION
LAYER 2-3
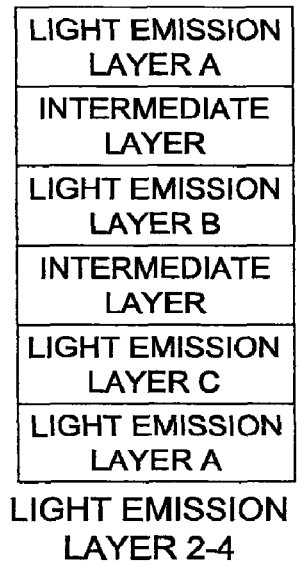
LIGHT EMISSION
LAYER 2-4
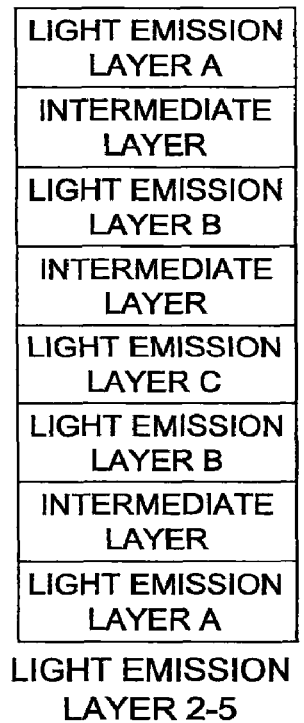
LIGHT EMISSION
LAYER 2-5

LIGHT EMISSION LAYER
(A,B,C,D 4 TYPES)

US 7,897,421 B2

ORGANIC ELECTROLUMINESCENT ELEMENT, DISPLAY AND ILLUMINATOR

CROSS REFERENCE TO RELATED APPLICATIONS

The present application is a continuation application of U.S. patent application Ser. No. 11/632,758, filed on Jan. 18, 2007, the entire contents of which are incorporated herein by reference. The Ser. No. 11/632,758 application is a U.S. national stage of application No. PCT/JP2005/012889, filed on 13 Jul. 2005, the contents of which are hereby incorporated by reference and priority to which is claimed herein. The PCT/JP2005/012889 application claimed priority under 35 U.S.C. §119(a) and 35 U.S.C. §365(b) to Japanese Application No. 2004-215728, filed 23 Jul. 2004, the disclosure of which is also incorporated herein by reference and priority to which is claimed herein.

TECHNICAL FIELD

The present invention relates to an organic electroluminescent element, a display and an illuminator.

BACKGROUND OF THE INVENTION

Electroluminescent element, hereinafter also referred to as EL element, is superior in the visibility since it emits light itself, and the element including the driving circuit for it can be made light because the element can be driven by a low voltage of from several to several tens volt. Therefore, the organic EL element is expected to be applied for thin type displays, illuminators and backlights.

It is also a feature of the organic EL element that it has abundant color variation. Moreover, it is also a feature that various colors can be obtained by mixing plural colors of the emitted light.

Among the colors of the emitted light, need for white color light is especially high, such the light can be also applied for the backlight. Moreover, the white light can be separated into blue, green and red pixels.

For emitting such the white light, the following two methods can be applied.

1. To dope plural light emitting compounds into a light emission layer
2. To combine plural colors of light each emitted from plural light emission layers For instance, when the above method 1 using a vacuum vapor deposition method is applied for attaining such the white color by mixing by three colors of blue (B), green (G) and red (R), a vapor deposition of four elements of B, G, R and a host compound should be carried out, which is difficulty controlled.

In another way, a method can be applied, in which a solution formed by dissolving or dispersing the B, G, R and host compounds is coated. However, it is a problem that the coated type EL element is inferior in the durability to the vapor deposited type element.

On the other hand, a method of the above 2 by combining plural light emission layers is proposed. Such the method is easier than the method of 1 when the vapor deposition is applied.

As such the white light emission EL element, an element is proposed in which a blue light emitting layer as a short wavelength light emission layer and a red light emission layer as a long wavelength light emission layer are laminated so as to emit white light by mixing light each emitted from these two light emission layers, for example, cf. Patent Document 1.

However, in the element having the two laminated light emission layers different from each other in the color of the emitting light (different in the peak wavelength of emitted light), the light emitting center is moved by variation in the layer quality or transportability of the positive hole and the electron accompanied with the variation in the driving time or variation in the light emitting time and the applied voltage so that the chromaticity tends to be varied.

Such the problem is actualized when white light is obtained by mixing light emitted from the two light emission layers since white light is sensitive for variation in the chromaticity.

An EL element emitting mixed light composed of lights each different in the peak wavelength emitted from each of plural light emission layers is disclosed, in which three or more light emission layers each emitting light different in the peak wavelength are alternatively laminated, as a method for inhibiting the chromaticity variation caused by the variation in the driving time and the voltage as low as possible, for example, cf. Patent Document 2.

Moreover, a method for designing the laminated structure having two or more layers utilizing the thickness of the light emission layer and the ratio of an organic host material to a fluorescent material as parameters of the light emission efficiency, for example, cf. Patent Document 3.

The above means are effective for inhibiting chromaticity deviation by alternatively laminating the layers even when the balance of injection of the carriers is lost in some degree. It is found, however, that the light emitting efficiency is low, energy transfer between the layers is caused and deviation in the whiteness is observed so that such the elements are insufficient in the white light emission.

As an example of attaining white light by the combination of plural light emission layers, an element having two light emitting layers each different in the emitting light color and an intermediate layer arranged between the light emission layers is disclosed, for example, cf. Non-patent Document 1.

The above technique, however, has the following problems:

1. Color of emitted light is deviated depending on the applied voltage (electric current).
2. The efficiency is not attained to the theoretical limit.
3. The process is made complex by the formation of the intermediate layer.

The above problems remain as the problems to be solved.

Patent Document 1: Japanese Patent Publication Open to Public Inspection (hereafter referred to as JP-A) No. 7-142169
Patent Document 2: JP-A No. 2003-187977
Patent Document 3: JP-A No. 2004-63349
Non-patent Document 1: Applied Physics Letters, Vol. 83, 2459 (2003) and Advanced Materials, Vol. 14, No. 2, 147 (2002)

SUMMARY OF THE INVENTION

An object of the present invention is to provide an organic electroluminescent displaying high external quantum efficiency or high light emission efficiency and inhibited in the chromaticity deviation, a display and an illuminator.

One embodiment of the present invention for attaining the above object is an organic electroluminescent element comprising an anode; a cathode; at least two light emission layers provided between the anode and the cathode; and at least one intermediate layer provided between the two light emission layers, wherein the two light emission layers each comprise the same host compound A; one of the two light emission layers comprises light emission dopant A and the other light emission layer comprises light emission dopant B which is different from light emission dopant A; and the intermediate layer comprises host compound A.

BRIEF DESCRIPTION OF THE DRAWINGS

FIG. 4 shows a schematic drawing of a display of passive matrix system.

FIG. 5 shows a schematic drawing of the sealing structure of Organic EL Element 1-1.

FIGS. 6a and 6b show schematic drawings of an illuminator having EL elements.

FIG. 9 shows an example of layer constitution of the organic EL element.

FIG. 10 shows layer structures of the organic EL element of the present invention.

FIG. 11 shows layer structures of the organic EL element of the present invention.

DESCRIPTION OF THE PREFERRED EMBODIMENTS

Figure 1:
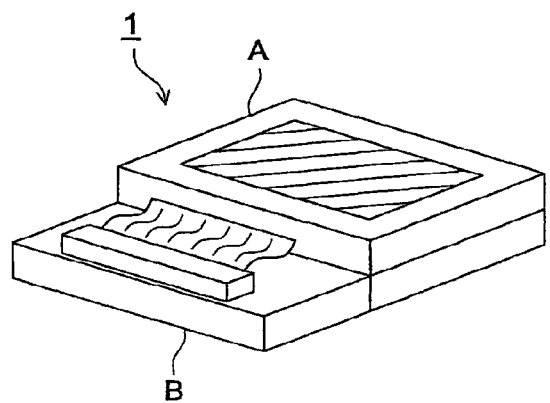
FIG. 1 shows a schematic drawing of an example of display constituted by organic EL elements.

The object of the present invention is attained by the following constitutions of (1) to (16).

(1) An organic electroluminescent element comprising an anode; a cathode; at least two light emission layers provided between the anode and the cathode; and at least one intermediate layer provided between the two light emission layers, wherein
  the two light emission layers each comprise the same host compound A;
  one of the two light emission layers comprises light emission dopant A and the other light emission layer comprises light emission dopant B which is different from light emission dopant A; and
  the intermediate layer comprises host compound A.

(2) The organic electroluminescent element of Item (1), wherein at least one of dopants A and B is a phosphorescent compound.

(3) The organic electroluminescent element of Item (1), wherein
  each of dopants A and B is a phosphorescent compound.

(4) The organic electroluminescent element of any one of Items (1) to (3), wherein a thickness of the intermediate layer is larger than a Förster distance between light emission dopant A and light emission dopant B.

(5) The organic electroluminescent element of any one of Items (1) to (4), wherein host compound A is a carbazole derivative.

(6) The organic electroluminescent element of any one of Items (1) to (4), wherein host compound A is a carboline derivative or a diazacarbazole derivative.

(7) The organic electroluminescent element of any one of Items (1) to (6) comprising at least one type of light emission layers comprising two or more layers of the same type showing the same light emission peak.

(8) The organic electroluminescent element of any one of Items (1) to (8) comprising at least two types of light emission layers, each type comprising two or more layers of the same type showing the same light emission peak.

(9) The organic electroluminescent element of any one of Items (1) to (8) comprising at least two types of light emission layers A and B, wherein
  light emission layer A or light emission layer B comprises two or more layers; and
  light emission layer A, light emission layer B and the intermediate layer are laminated alternately.

(10) The organic electroluminescent element of any one of Items (1) to (9) comprising at least three types of light emission layers A, B and C, wherein
  at least one of light emission layers A, B and C comprises two or more layers; and
  the light emission layers A, B and C are laminated periodically.

(11) The organic electroluminescent element of any one of Items (1) to (10), wherein
  the organic electroluminescent element comprises a hole blocking layer provided between a light emission layer and the cathode; and
  at least one of the hole blocking layer is provided adjacent to the light emission layer.

(12) The organic electroluminescent element of any one of Items (1) to (11), wherein
  the organic electroluminescent element comprises an electron blocking layer provided between the light emission layer and the anode; and
  at least one of the electron blocking layer is provided adjacent to the light emission layer.

(13) The organic electroluminescent element of any one of Items (1) to (12) emitting white light.

(14) The organic electroluminescent element of any one of Items (1) to (13), wherein the light emission layer comprises a light emission dopant having at least one of substructures represented by Formulas (A) to (C).

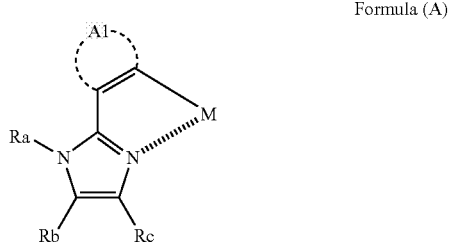

Formula (A)

wherein, Ra is a hydrogen atom, an aliphatic group, an aromatic group or a heterocyclic group, Rb and Rc each are a hydrogen atom or a substituent, A1 is a residue necessary to form an aromatic ring or an aromatic heterocyclic ring and M is Ir or Pt;

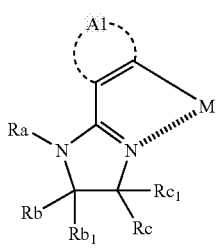

Formula (B)

wherein Ra is a hydrogen atom, an aliphatic group, an aromatic group or a heterocyclic group, Rb, Rc, $Rb_1$ and $Rc_1$ each are a hydrogen atom or a substituent, A1 is a residue necessary to form an aromatic ring or an aromatic heterocyclic ring and M is Ir or Pt;

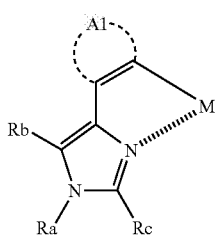

Formula (C)

wherein Ra is a hydrogen tom, an aliphatic group, an aromatic group or a heterocyclic group, Rb and Rc each are a hydrogen atom or a substituent, A1 is a residue necessary to form an aromatic ring or an aromatic heterocyclic ring and M is Ir or Pt.

(15) A display comprising the organic electroluminescent element of any one of Items (1) to (14).

(16) An illuminator comprising the organic electroluminescent element of any one of Items (1) to (14).

In the present invention, an organic EL element having high external quantum efficiency or high light emission efficiency and small chromaticity deviation could be provided by the constitution described in any one of the above (1) to (14). Furthermore, a display and an illuminator using the above element could be provided.

Each of the constitutions of the present invention is successively described in detail below.

The inventors investigated deviation of chromaticity of the emitted white light when plural kinds of light emission layers are combined and an intermediate layer is provided between the light emission layers. As a result of the investigation, it is noted that two reasons such as that the confinement of the exciton is insufficient and injection balance of positive hole and electron through the intermediate layer is not constant related to the deviation of chromaticity of the emitted light.

In the present invention, it has been clarified that, by using the same compound as the host material for forming the intermediate layer and the light emission layer, the injection barrier between the layers is lowered, whereby the injection balance of the positive hole is made constant even when the driving voltage or current is changed, resulting in notably reducing the chromaticity deviation.

Moreover, from the viewpoint of the production of the organic EL element, it is succeeded to considerably simplify the production process compared with usual processes by using the common material for the host compound and the intermediate layer.

It has been also succeeded to effectively confine the triplet exciton of the light emission layer by using the material in the intermediate layer, which has triplet excitation energy higher than that of the phosphorescent compound in the light emission layer. Furthermore, by making the thickness of the intermediate layer thicker than the Foester distance, the chromaticity deviation was reduced since the energy transfer of the exciton was suppressed and an element exhibiting a high efficiency was obtained. The laminating order of the light emission layers may be either regular or random, and the intermediate layers are not necessary to be wholly provided and may be provided only at the necessary position.

<<Light Emission Layer>>

The light emission layer relating to the present invention is described below.

An example of the layer constitution of the organic EL element according to the present invention is described below referring FIG. 9 but the present invention is not limited thereto (the detailed layer constitution will be described later).

In the structure of the element constitution shown in FIG. 9, the element has the light emission layer provided between the cathode and the anode and the light emission layer is put between an electron blocking layer and a hole blocking layer.

Though the electron blocking layer or the hole blocking layer is not always necessary, these layers is preferably provided since the carriers of electrons-positive holes can be confined in the light emission layer and the exciton generated by recombination of the electron and the positive hole can be also confined in the light emission layer by applying the constitution shown in FIG. 9 (the electron blocking layer and the hole blocking layer will be described later).

Known materials can be used for forming the electron blocking layer and the hole blocking layer.

It is preferable that the material for forming the electron blocking layer has electron affinity lower than that of the material for forming the light emission layer for confining the electron so as not to leak the electron from the light emission layer.

It is preferable that the material for forming the hole blocking layer has ionization potential higher than that of the material for forming the light emission layer for confining the electron so as not to leak the electron from the light emission layer.

For confining the triplet exciton generated by the recombination of the electron and the positive hole, the materials forming the electron blocking layer or the hole blocking layer are higher than the phosphorescent compound of the light emission layer in the triplet exciton energy.

A hole transport layer and an electron transport layer are preferably provided so as to sandwich them. Known materials can be used for forming the hole transport layer and the electron transport layer. It is preferable that these materials each have high electroconductivity for lowering the diving voltage.

Examples of the constitution of the light emission layer are described referring FIGS. 10 to 18.

Only the light emitting portions are shown for light emission layers 1-1 to 3-6.

In the present invention, the light emission layer is constituted to have at least two layers and preferably used is an embodiment in which at least one type of light emission layers comprising two or more layers of the same type showing the same light emission peak as described in claim 7 or an embodiment in which at least two types of light emission layers, each type comprising two or more layers of the same type showing the same light emission peak as described in claim 8.

In the present invention, "the two layers exhibit the same light emission peak" is defined as follows, namely, when the two peaks of light obtained from the two light emission layers are analyzed via a PL measurement, the difference between the two emission peak wavelengths is less than 10 nm.

In the PL measurement, the emission peak wavelength can be determined by preparing a vapor deposited layer having the same composition of the light emission dopant and the host compound to be used in the light emission layer on a quartz substrate or preparing a thin layer of the composition such as a polymer by a spin coating method or dipping method when the layer is prepared by a wet process, and by measuring the emitted light of the above prepared vapor deposited layer or the thin layer by a fluorescence spectral photometer.

Though the color of emitted light from the organic EL element is not specifically limited, white light is preferred.

In the case of that the element has two kinds of light emission layer each different in the light emitting peak, a combination of light emission layers each emitting blue light and yellow light or bluish green light and red light is preferable for obtaining white light. When three kinds of light emission layers having different light emission peaks are used, a combination of ones each emitting blue, green or red light are preferable for obtaining white light.

Such the element can be used for various light sources such as an illuminator and a backlight.

When four kinds of light emission layer different in the light emission peak from each other are used, white light can be obtained by combining blue, bluish green, yellow and red. Other than the above, a layer can be added for compensating the white color obtained by the combination of blue, green and red.

In the present invention, the emitted light is not limited to white light.

When a single color such as blue, green or red is emitted, the fine control of the color can be actualized by emitting light by plural light emission layers different in the light emitting peak from each other.

In the light emission layer relating to the present invention, the plural light emission layers may be laminated cyclically or randomly.

The layers are preferably arranged so that the chromaticity deviation caused by the variation of the applied voltage (current) is made minimum.

The cyclical arrangements such as Light Emission Layers 1-3 to 1-6, 2-2, 2-5, 2-6, 2-7, 2-8, 2-9, 3-3, 3-4, 3-5 and 3-6 are preferable.

By such the arrangement, the deviation of the emitted light color can be reduced even when the light emitting position is shifted in the thickness direction by the variation of the applied voltage (current).

On the other hand, when plural color lights each generated from plural light emission layers are combined, the plural layers are laminated alternatively, cyclically or randomly for inhibiting the chromaticity deviation to minimum. In such the case, number of the face contacting with the adjacent layer is increased and chance of energy transfer between the layers is increased so that the problem the same as that in the white light emission element constituted by single light emission layer is caused.

The energy transfer in the organic EL element is principally Förster type, however, the energy transfer distance is large in the Förster energy transfer.

For the Förster type energy transfer, it is an important factor that the integral strength of overlapping of the emitted light spectrum of the donor molecule and the absorption spectrum of the acceptor molecule is basically large.

In the case of the fluorescent compound, the singlet excitation energy transfer distance is increased when the spectra are overlapped since the fluorescent quantum yield and mole light absorption coefficient are raised.

In the phosphorescent compound, the energy transfer at the triplet excitation energy transfer occurs, the same as in the fluorescent compounds, when T←G absorption is observed. About Förster energy transfer, Joseph R. Lakowicz, "Principles of Fluorescence Spectroscopy", p. 368, Kluwer Academic Plenum Publisher can be referred. However, the mole light absorption coefficient of the T←G absorption is very small compared with that of the fluorescent compound. Therefore, the Förster type energy transfer distance in the phosphorescent compound is extremely smaller than that of the fluorescent compound.

In the present invention, the Förster energy transfer between the light emission layers can be suppressed by providing an intermediate layer having triplet excitation energy higher than that of the light emission layer, whereby the element having high efficiency and showing limited chromaticity deviation can be obtained.

The energy transfer between the light emission dopants in the adjacent layers is progressed by Förster type. Therefore, the lamination order of the light emission layers can be decided so that the Förster distance becomes small. The Förster distance is a distance, at which the ratio of the probability of transfer and that of internal conversion of energy is 1:1, and the energy transfer is principally caused in a distance smaller than the Förster distance and the energy transfer difficulty occurs in a distance larger than that. About Förster type distance, Joseph R. Lakowicz, "Principles of Fluorescence Spectroscopy", p. 368, Kluwer Academic Plenum Publisher can be referred.

Förster distance of some samples of phosphorescent compound was measured. Results of the measurement are listed below. The structures of the phosphorescent compounds are shown in the later mentioned description regarding the light emission dopant.

| Phosphorescent compound (Also called light emission dopant) | Förster type energy transfer distance |
|---|---|
| Ir-12 → Ir-9 | 2.3 nm |
| Ir-12 → Ir-1 | 1.8 nm |
| Ir-13 → Ir-1 | 2.4 nm |
| Ir-1 → Ir-9 | 1.8 nm |

The measurement was carried out by the method described in Joseph R. Lakowicz, "Principles of Fluorescence Spectroscopy", p. 368, Kluwer Academic Plenum Publisher.

The distance in other fluorescent compounds (also referred to as light emission dopant) described in the later examples are not more than 3 nm similar to the above compounds.

Though the Förster type energy transfer distance of the phosphorescent compound is smaller than that of the fluorescent compound, it is confirmed that the transfer occurs in short distance. For instance, the Förster distance of the transfer from Ir-12 (Fir (also referred to as pic)) to Ir-9 (btp$_2$Ir (also referred to as (acac)) is 2.3 nm.

Though such the distance is small as the energy transfer distance, there is probability that chromaticity deviation and efficiency lowering caused by occurrence of the energy transfer becomes not preferable problems in the white light emission element.

In the present invention, the organic electroluminescent element inhibited in the chromaticity deviation and having high efficiency can be obtained by inhibiting the Förster type energy transfer by the intermediate layer provided between two light emission layers each containing different light emission dopant (phosphorescent compound), respectively.

It is understood from the above-mentioned that energy transfer can be effectively inhibited and the element having high efficiency and lowered in the chromaticity deviation can be obtained by setting the thickness of the intermediate layer (detail of the intermediate layer is described later) at a thickness of not less than 2.5 to 5 nm by that the energy transfer can be effectively inhibited.

Of course, the thickness of the intermediate layer can be made thinner when a combination of phosphorescent compounds each having small energy transfer distance is applied.

Moreover, the electric current-voltage characteristic can be varied by selection of the host compound.

The whole thickness of the light emission layer is preferably from 5 to 100 nm, more preferably from 7 to 50 nm and most preferably from 10 to 40 nm, although the thickness is not specifically limited.

The thickness of each of the plural light emission layers constituting the light emission layer is preferably from 1 to 20 nm and more preferably from 2 to 10 nm.

The thickness of the layer can be decided according to the element driving voltage, the chromaticity deviation responding to the voltage (current), the energy transfer and the difficulty of the production.

In the present invention, it is necessary to be contained the phosphorescent compound in at least one layer constituting the light emission layer and preferably in entire light emission layers.

(Light Emission Host and Light Emission Dopant)

The mixing ratio of the host compound which is the main component of the light emission layer to the light emission dopant is preferably from 0.1% to less than 30% by weight.

The light emission dopant may be a mixture of plural kinds of compound; the partner of mixing may be another metal complex or a fluorescent dopant.

The dopants (phosphorescent dopants and fluorescent dopants) capable of using together with the metal complex to be used as the light emission dopant are described below.

The light emission dopants can be roughly classified into a fluorescent dopant emitting fluorescence and a phosphorescent dopant emitting phosphorescence.

Typical examples of the former (fluorescent dopant) include a coumalin type dye, a pyrane type dye, a cyanine type dye, a chroconium type dye, a squalium type dye, an oxobenzanthracene type dye, a fluorescein type dye, a rhodamine type dye, a pyrylium type dye, a perylene type dye, a stilbene type dye, a polythiophene type dye and a rare-earth metal complex type fluorescent compound.

Typical examples of the later (phosphorescent dopant) are preferably a complex compound containing a metal included in Groups 8, 9 or 10 of periodic table, and more preferably an iridium compound and an osmium compound. Among them, the iridium compounds are most preferable.

Concretely that is the compounds described in the following patent publications.

WO 00/70655, JP-A Nos. 2002-280178, 2001-181616, 2002-280179, 2001-181617, 2002-280180, 2001-247859, 2002-299060, 2001-313178, 2002-302671, 2001-345183 and 2002-324679, WO 02/15645, JP-A Nos. 2002-332291, 2002-50484, 2002-332292 and 2002-83684, Published Japanese Translation of PCT International Publication No. 2002-540572, JP-A Nos. 2002-117978, 2002-238588, 2002-170684 and 2002-352960, WO 01/93642, JP-A Nos. 2002-50483, 2002-100476, 2002-173674, 2002-359082, 2002-175884, 2002-363552, 2002-184582 and 2003-7469, Published Japanese Translation of PCT International Publication No. 2002-525808, JP-A No. 2003-7471, Tokuhyou 2002-525833, and JP-A Nos. 2003-31366, 2002-226495, 2002-234894, 2002-235076, 2002-241751, 2001-319779, 2001-318780, 2002-62824, 2002-100474, 2002-203679, 2002-343572 and 2002-203678

A part of concrete examples will shown below.

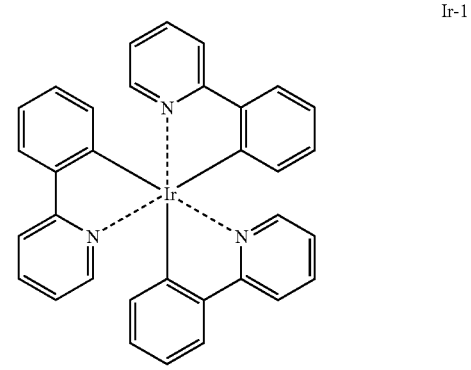

Ir-1

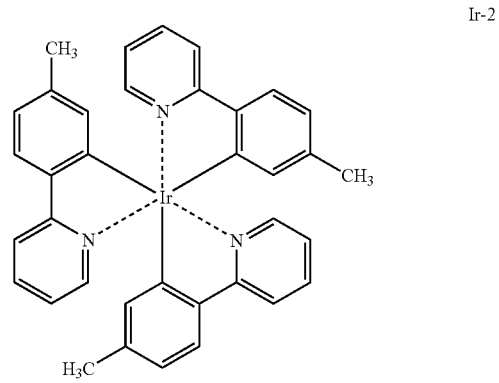

Ir-2

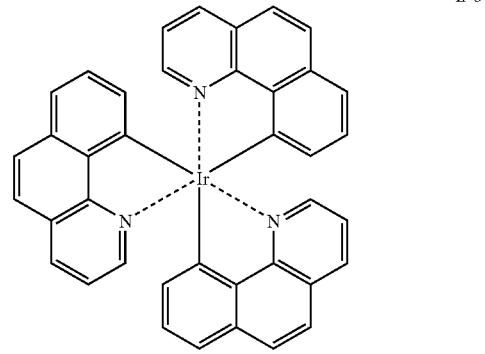

Ir-3

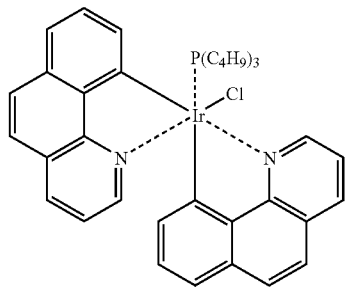
Ir-4
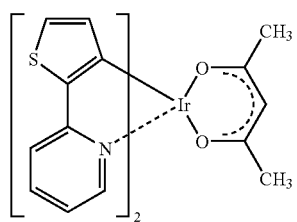
Ir-5
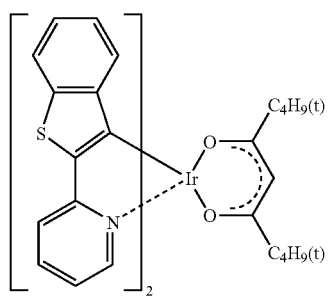
Ir-6
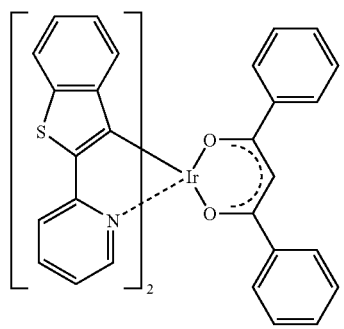
Ir-7
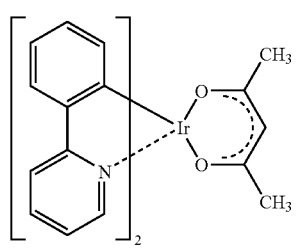
Ir-8
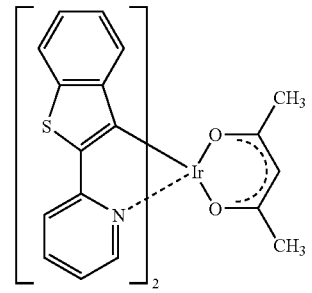
Ir-9
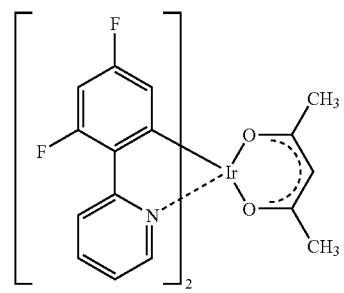
Ir-10
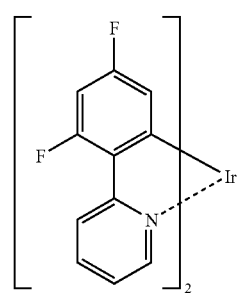
Ir-11
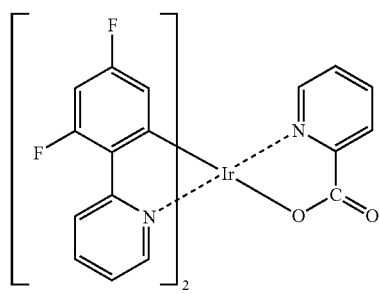
Ir-12
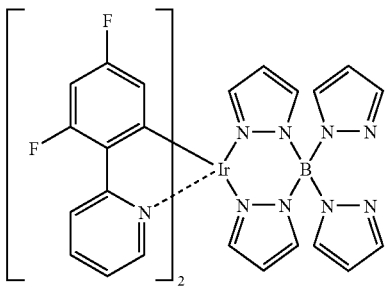
Ir-13

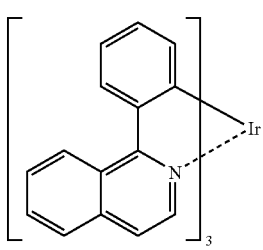

Ir-14

The light emission dopant compounds relating to the present invention having a partial structure represented by Formulas (A) to (C) are described below.

It is preferable to use a compound having a partial structure represented by Formulas (A) to (C) as the light emission dopant in at least one of the light emission layers of the light emission layer of the present invention. Particularly it is preferably to use those as the light emission dopant in the blue light emission layer.

In Formulas (A) to (C), A1 is a residue necessary to form an aromatic ring or an aromatic heterocyclic ring and examples of the aromatic ring include a benzene ring, a biphenyl ring, a naphthalene ring, an azulene ring, an anthracene ring, a phenanthrene ring, a pyrene ring, a chrysene ring, a naphthacene ring, a triphenylene ring, an o-terphenyl ring, a m-terphenyl ring, a p-terphenyl ring, an acenaphthene ring, a coronene ring, a fluorene ring, a fluoranthrene ring, a naphthacene ring, a pentacene ring, a perylene ring, a pentaphene ring, a picene ring, a pyrene ring, a pyranthrene ring and an anthranthrene ring, and examples of the aromatic heterocyclic ring include a furan ring, a thiophene ring, a pyridine ring, a pyridazine ring, a pyrimidine ring, pyrazine ring, triazine ring, a benzimidazole ring, an oxadiazole ring, a triazole ring, an imidazole ring, a pyrazole ring, a thiazole ring, an indole ring, a benzimidazole ring, a benzothiazole ring, a benzoxazole ring, a quinoquisaline ring, a quinazoline ring, a phthalazine ring, a carbazole ring, a carboline ring and a diazacarbazole ring (a ring in which one of the carbon atoms constituting a carboline ring is further substituted by a nitrogen atom).

In Formulas (A) to (C), Ra is a hydrogen atom, an aliphatic group, an aromatic group or a heterocyclic group, Rb, Rc, Rb₁ and Rc₁ are each a hydrogen atom or a substituent, and Ra is the same as the above Ra₁ and the substituent represented by Rb, Rc, Rb₁ or Rc₁ are the same as the substituents represented by the above R₁ to R₉, RA or RB.

The structure represented by Formulas (A) to (C) is a partial structure and ligands corresponding to the valent number of the central metal are necessary for completing the structure of the light emission dopant. Concrete examples of the ligand include a halogen atom such as a fluorine atom, a chlorine atom, a bromine atom and an iodine atom, an aryl group such as a phenyl group, a p-chlorophenyl group, a mesityl group, a tolyl group, a xylyl group, a biphenyl group, a naphthyl group, an anthryl group and a phenanthryl group, an alkyl group such as a methyl group, an ethyl group, an isopropyl group, a hydroxylethyl group, a methoxymethyl group, a trifluoromethyl group and a t-butyl group, an alkyloxy group, an aryloxy group, an alkylthio group, an arylthio group, a heterocyclic group such as a furyl group, a thienyl group, a pyridyl group, a pyridazinyl group, a pyrimidinyl group, a pyrazinyl group, a triazinyl group, an imidazolyl group, a pyrazolyl group, a thiazolyl group, a quinazolinyl group, a carbazolyl group, a carbolinyl group and a phthalazinyl group and a partial structure represented by Formulas (A) to (C) without metal moiety.

In Formulas (A) to (C), M is Ir or Pt and Ir is particularly preferable. A tris compound completed by three partial structures of Formulas (A) to (C) is preferred.

Examples of the dopant compound relating to the present invention having the partial structures represented by Formulas (A) to (C) are listed below but the compound is not limited to them.

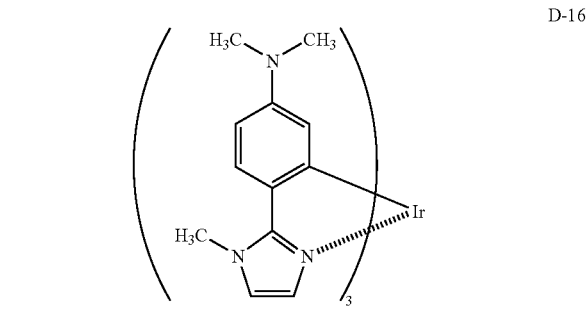

D-16

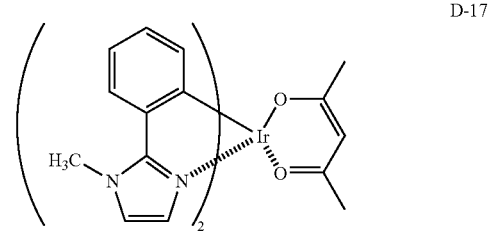

D-17

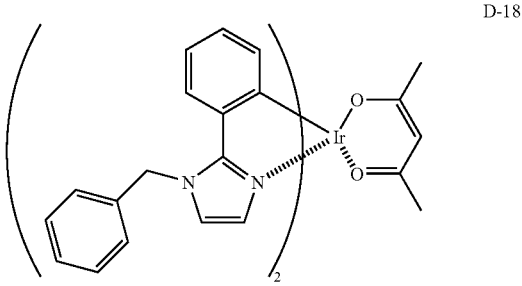

D-18

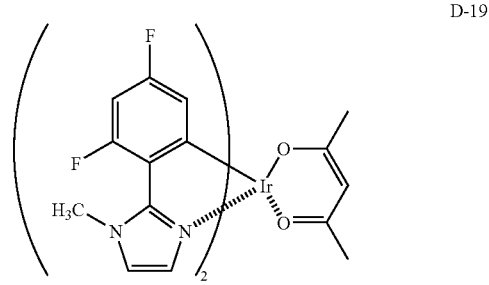

D-19

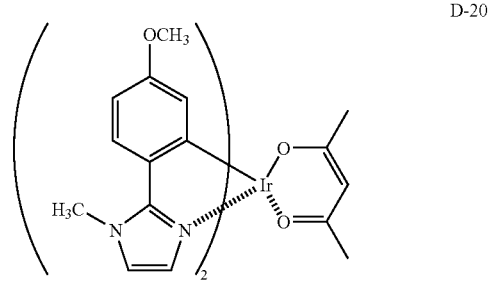

D-20

-continued
D-21
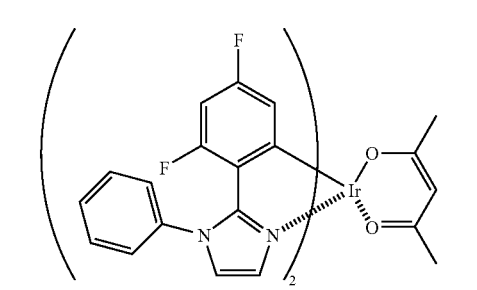
D-22
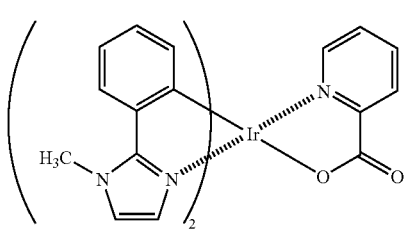
D-23
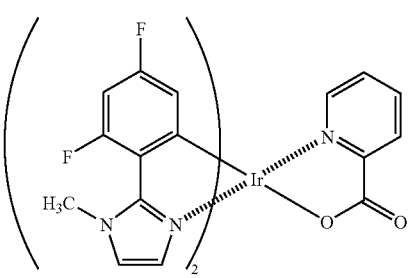
D-24
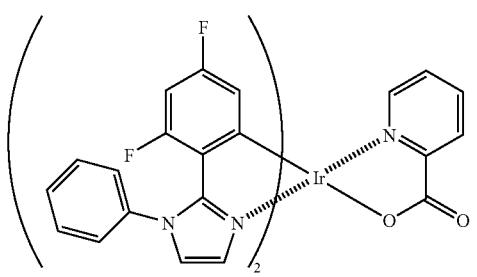
D-25
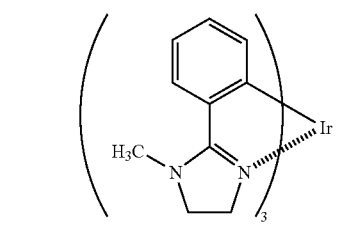
D-26
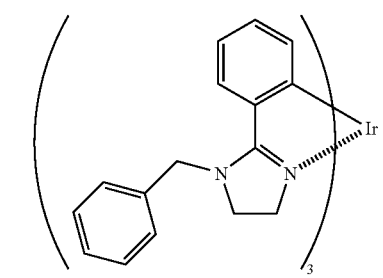
-continued
D-27
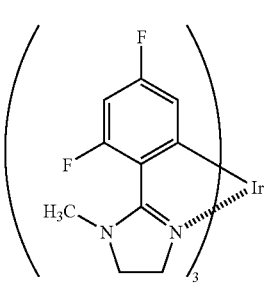
D-28
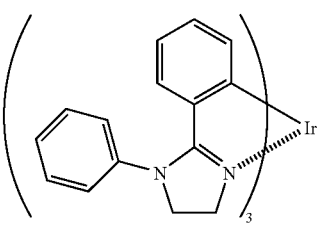
D-29
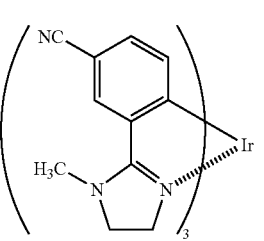
D-30
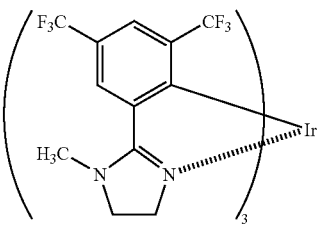
D-31
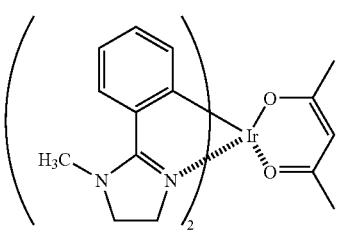
D-32
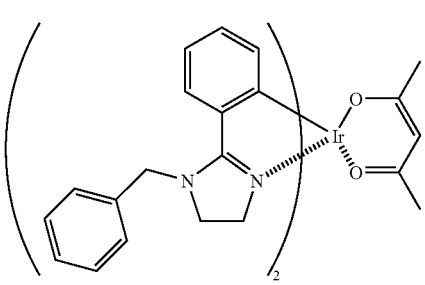

-continued
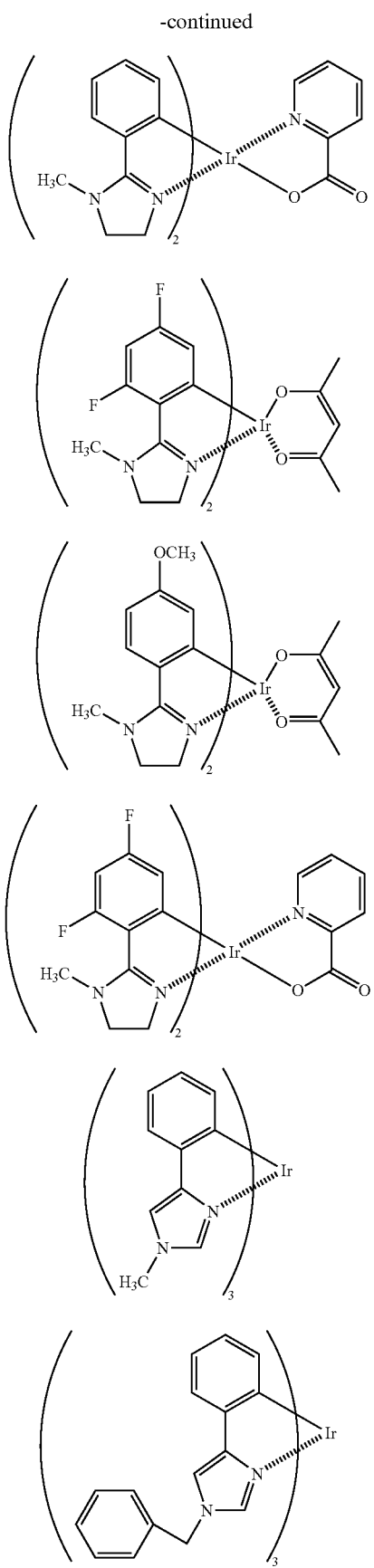
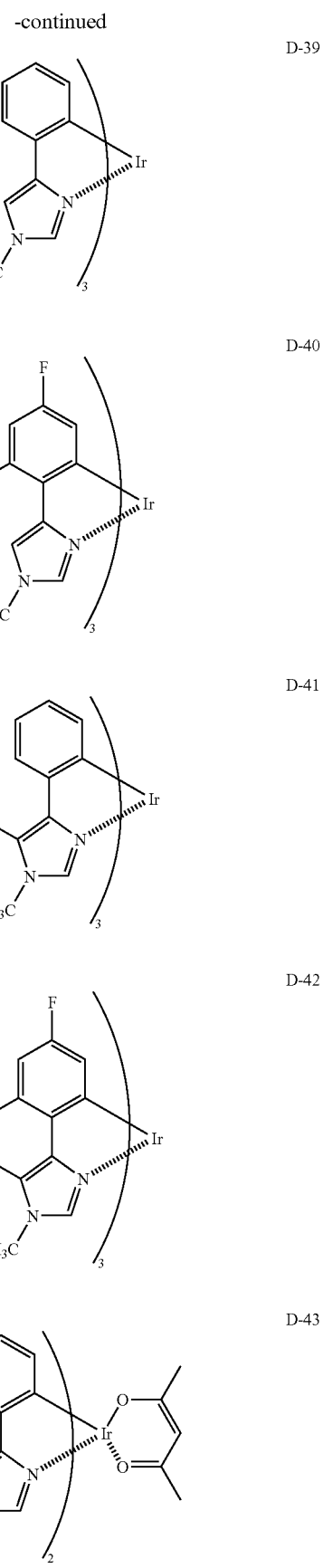

-continued
D-44
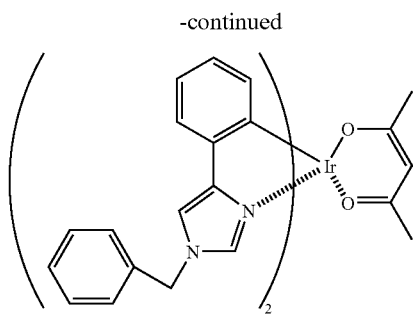
D-45
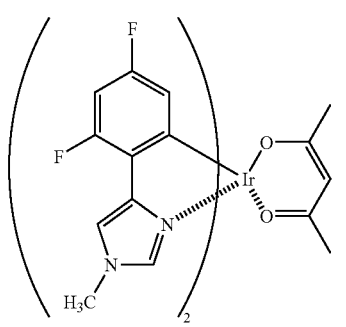
D-46
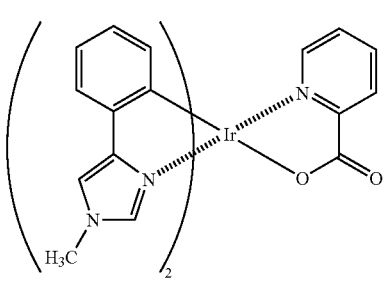
D-47
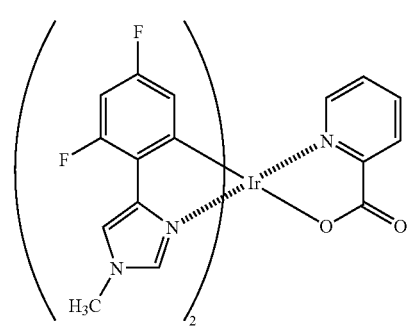
D-48
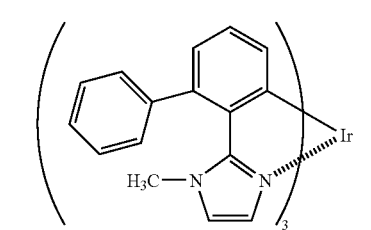
-continued
D-49
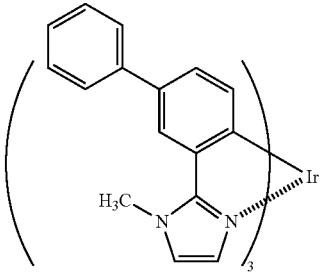
D-50
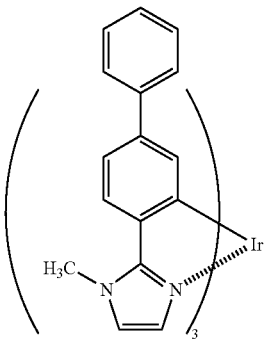
D-51
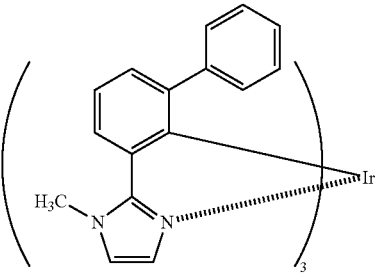
D-52
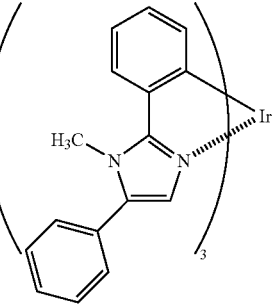
D-53
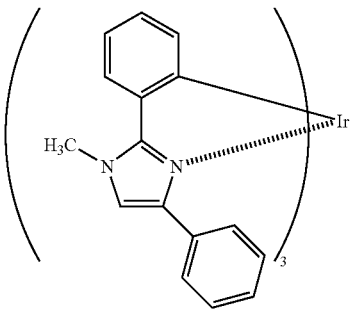

-continued
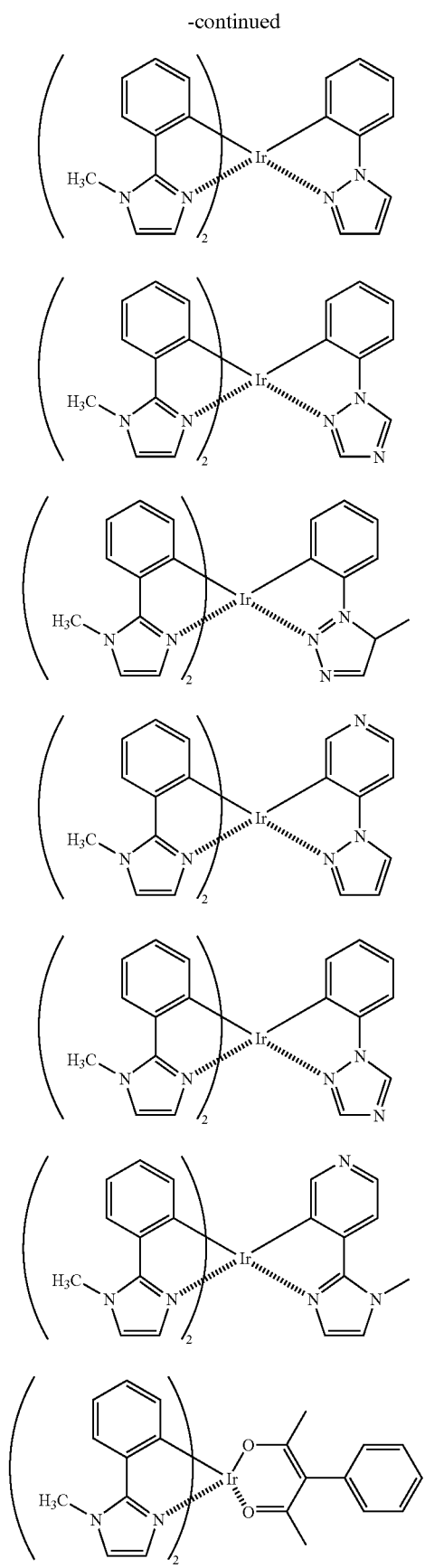
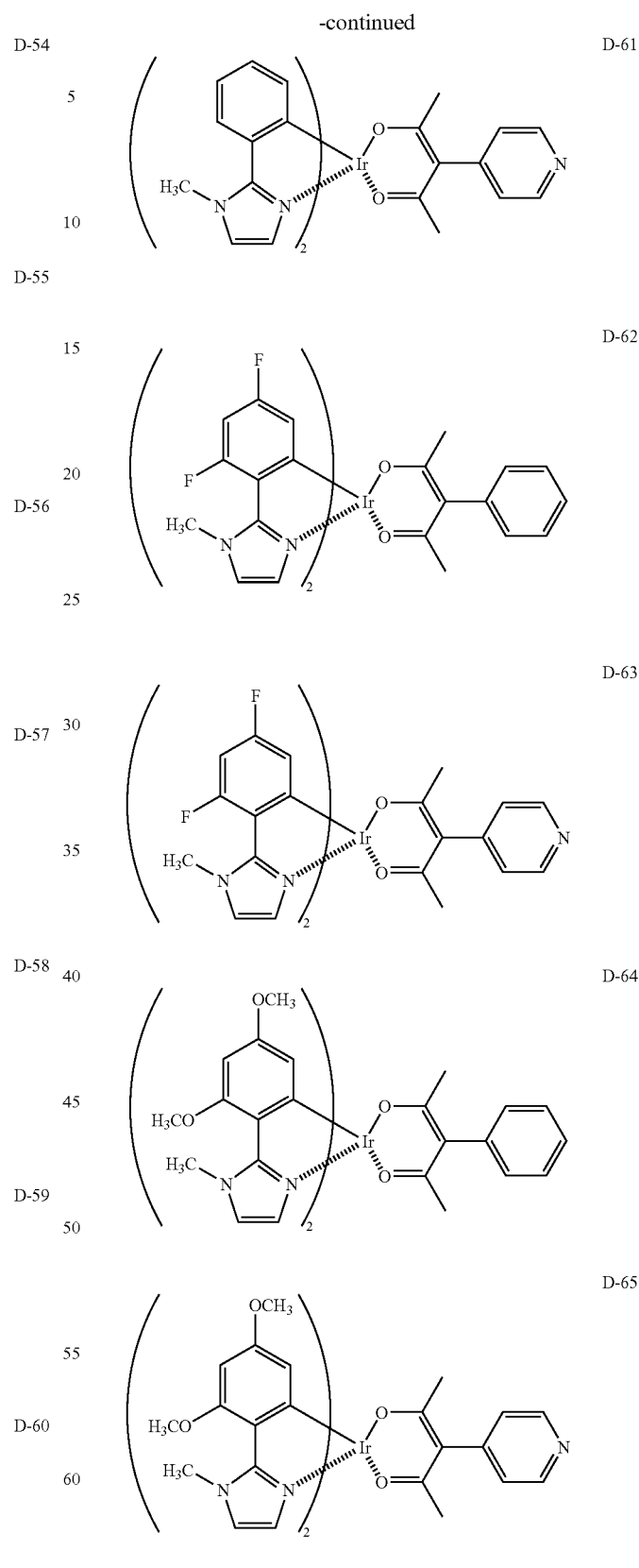
A Synthesizing example of compound having the partial structure represented by Formulas (A) to (C) is described below.

Synthesizing Example of D-1

Synthesizing Example

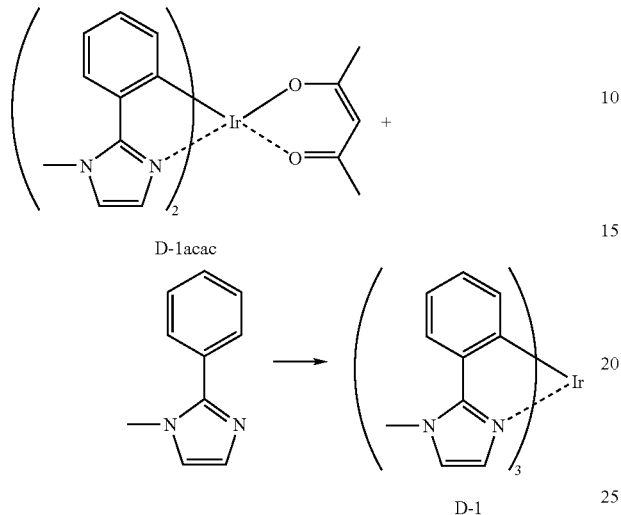

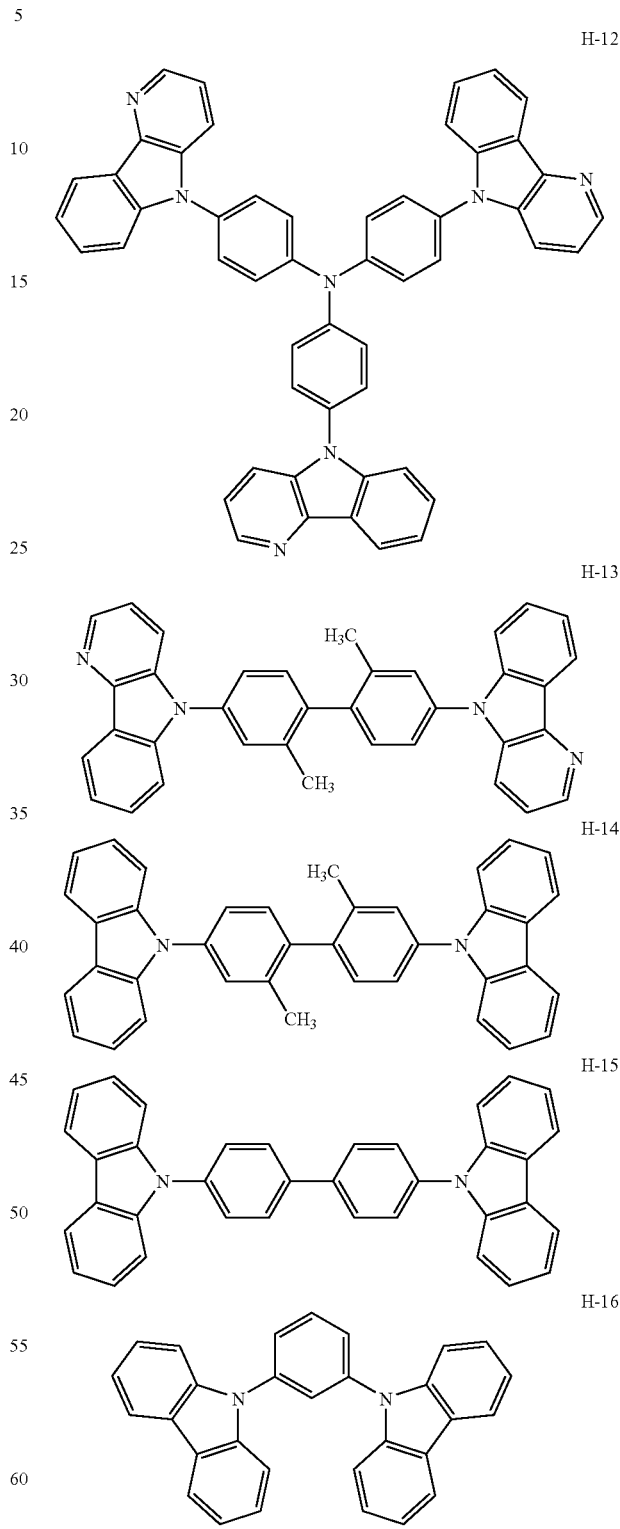

In to a 500 ml three-mouth flask, 4.0 g of D-1acac, 2.6 g of phenylimidazole and 300 ml of glycerol were charged and a thermometer, a cooler were attached onto the flask. The flask was set on an oil bath stirrer and the temperature of the bath was controlled so that the content of the flask was gradually heated and held at 150° C. The content of the flask was stirred for 5 hours for completing the reaction. Crystals were precipitated by cooling the content by room temperature. The reacting liquid was diluted by 200 ml of methanol and the crystals were separated by filtration and sufficiently washed by methanol and dried. Thus 1.6 g (36.5%) of product was obtained. It was confirmed by $^1$H-NMR and MASS that the obtained crystals were D-1.

(Light Emission Host)

The light emission host (also simply referred to as host) is a compound having the highest content by weight in the two or more compounds constituting the light emission layer and a compound other than the host is referred to as a dopant compound (also simply referred to as dopant). For instance, when the light emission layer is constituted Compound A and Compound B and the ratio of A to B is 10:11, Compound A is the dopant compound and compound B is the host compound. When the light emission layer is constituted by three Compounds A, B and C and the ratio of A:B:C is 5:10:85; Compounds A and B are the dopant compounds and Compound C is the host compound.

Though the structure of the light emission host to be used in the present invention is not specifically limited, a compound having a basic skeleton of a carbazole derivative, a triarylamine derivative, an aromatic borane derivative, a nitrogen-containing heterocyclic compound, a thiophene derivative, a furan derivative or an oligoarylene compound or a carboline derivative and a diazacarbazole derivative are cited. The diazacarbazole derivative is a compound formed by substituting at least one carbon atoms of the hydrocarbon ring constituting the carboline ring of the carboline derivative by a nitrogen atom.

Among them, the carboline derivatives and the diazacarbazole derivatives are preferably used.

Concrete examples of the carboline derivative and the diazacarbazole derivative are listed below but the present invention is not limited to them.

The host compound to be used in the present invention may be either a low molecular weight compound or a high molecular compound having repeating units. A low molecular weight compound having a polymerizable group such as a vinyl group and an epoxy group (vapor depositing polymerizable light emission host) may also be usable.

As the light emission host, a compound is preferable which has hole transport ability, electron transport ability and ability for preventing the prolongation of the wavelength of emitting light and a high glass transition point Tg.

As the examples of the light emission host, the compounds described in the following publications are suitable. For example, JP-A Nos. 2001-257076, 2002-308855, 2001-313179, 2002-319491, 2001-357977, 2002-334786, 2002-8860, 2002-334787, 2002-15871, 2002-334788, 2002-43056, 2002-334789, 2002-75645, 2002-338579, 2002-105445, 2002-343568, 2002-203683, 2002-363227, 2002-231453, 2003-3165, 2002-234888, 2003-27048, 2002-255934, 2002-260861, 2002-280183, 2002-299060, 2002-302516, 2002-305083, 2002-305084 and 2002-308837

<<Production Method of Light Emission Layer>>

The production method of the light emission layer relating to the present invention is described below.

Figure 7:
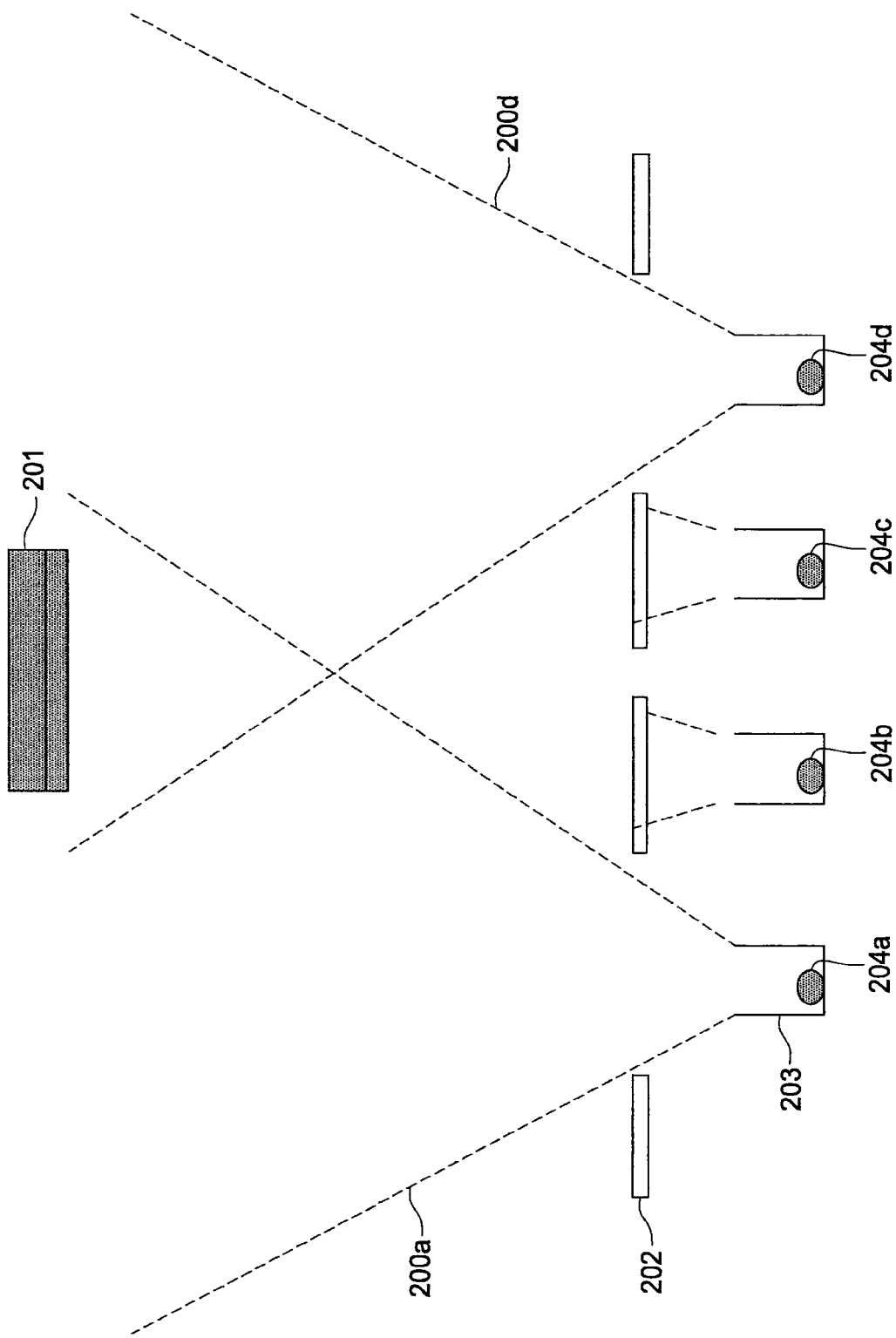
FIG. 7 shows a schematic drawing of an example of vapor deposition to be applied for forming the light emission layer of organic EL element.
Figure 8:
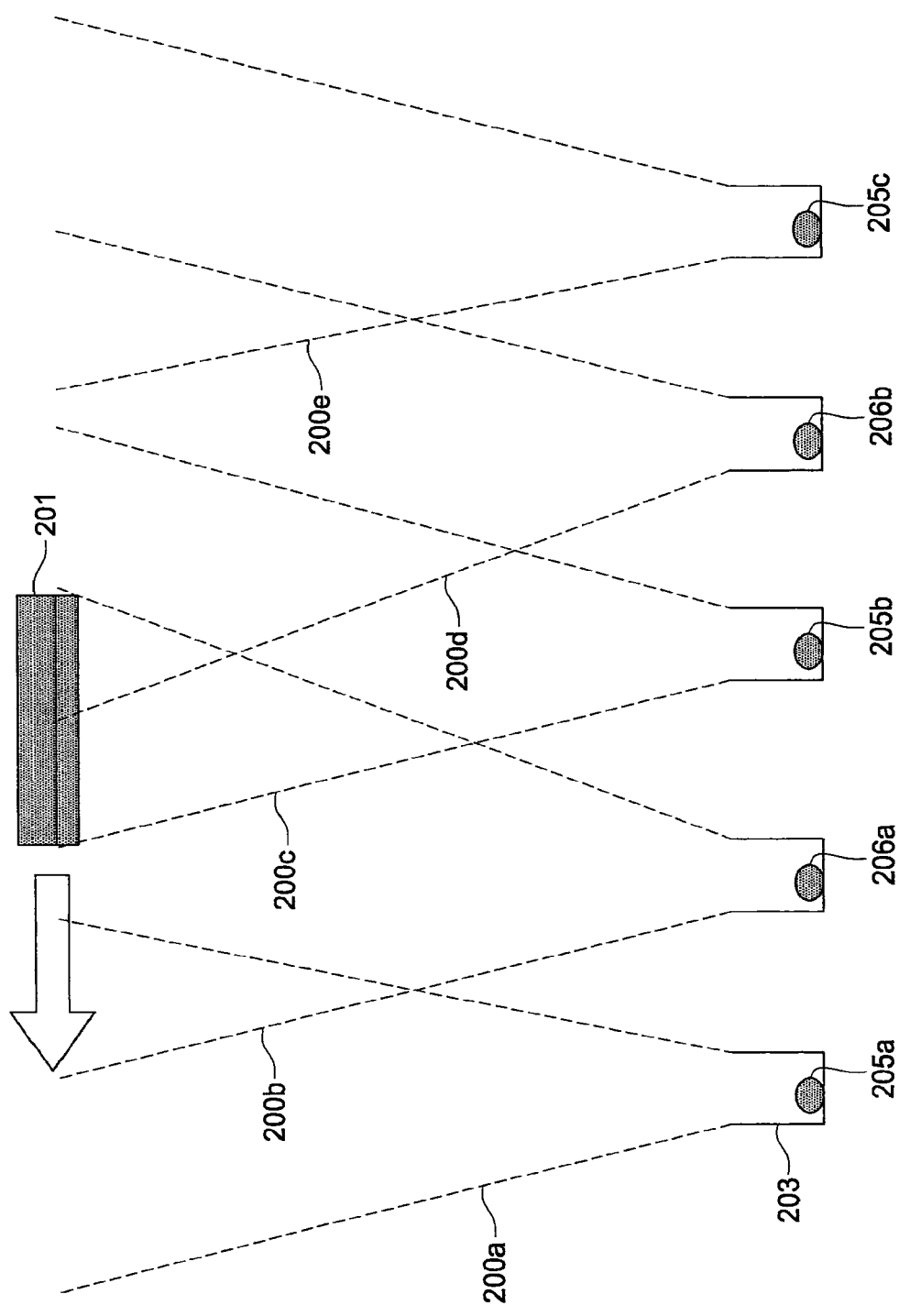
FIG. 8 shows a schematic drawing of an example of vapor deposition to be applied for forming the light emission layer of organic EL element.
Figure 12:
FIG. 12 shows layer structures of the organic EL element of the present invention.
Figure 13:
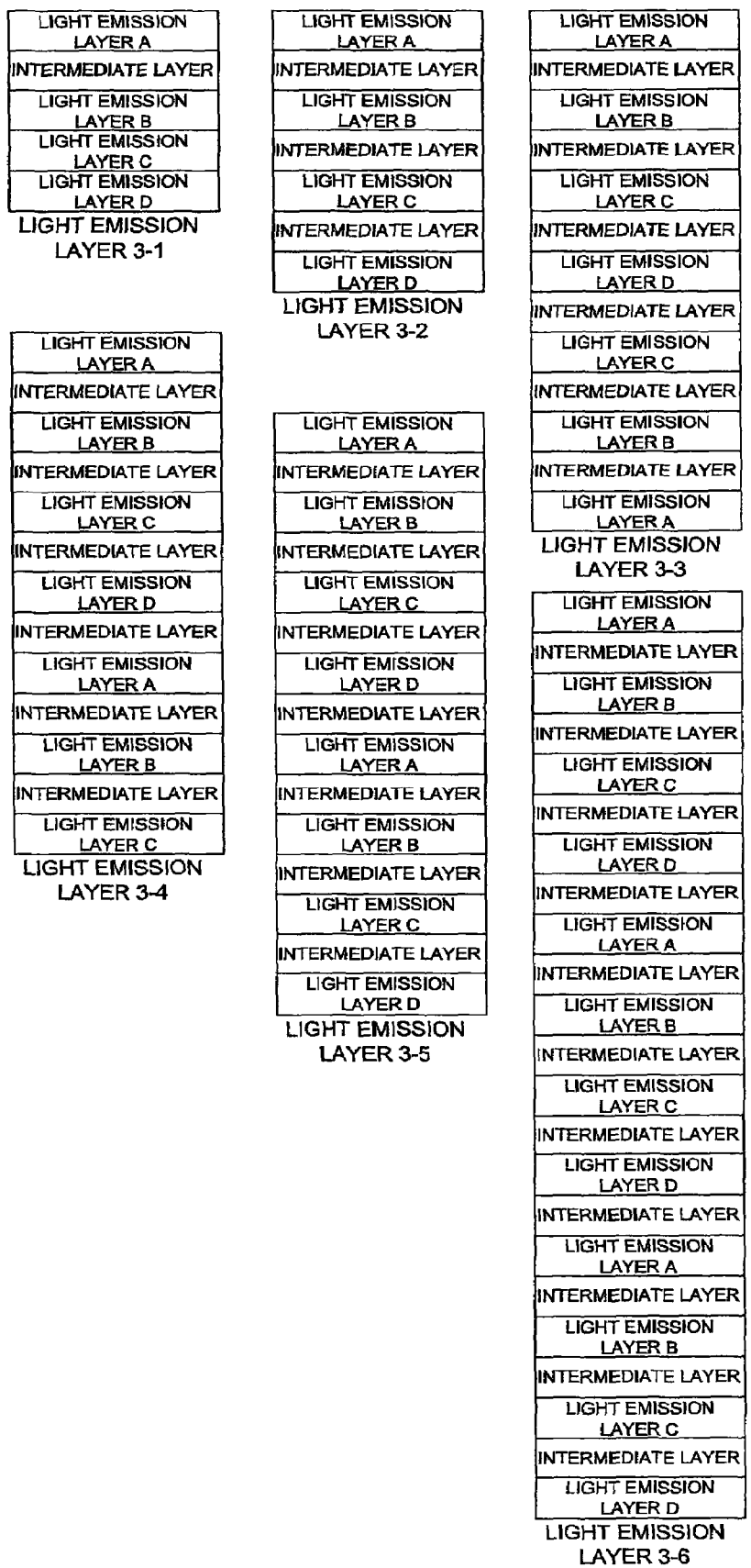
FIG. 13 shows layer structures of the organic EL element of the present invention.

An example of the production method of the light emission layer relating to the present invention is described referring FIGS. 7 and 8 but the present invention is not limited to them.

For example, four vapor deposition sources namely three kinds of crucible 204a, 204b and 204c in each of which the light emission dopants were charged, respectively, and a crucible in which the compound for the host material and the intermediate layer forming material is charged are prepared; the crucible may be a heating boat.

The speed of vapor deposition of the dopants or the host material and the intermediate layer forming material are suitably controlled by heating each of the vapor sources. Therefore, a shutter 202 was provided for optionally shutting the vapor deposition.

The shutter for vapor deposition of the host material and the intermediate layer forming material is usually opened and not closed. The shutters 202 each provided to the light emission dopant evaporation crucible 203 is closed or opened according to necessity so as to control the co-deposition condition.

The light emission layer is formed by vapor deposition when the shutter is opened, and the intermediate layer can be formed by deposition when the shutters 202 for the dopants are entirely closed.

Hitherto, the vapor sources for deposition corresponding to the kinds of the material are necessary in the production of intermediate layer when the materials for forming each of the layers are different from each other, moreover, it is very difficult to suitably controlling each of the deposition conditions; these are large problems in the production process.

In the present invention, the depositing condition for forming the layer can be changed by opening and closing the one shutter even when many light emission layers to be formed. Therefore, the light emission layer having many laminated layers such as those shown in FIGS. 10 to 13 can be easily formed.

FIG. 8 shows an example in which the host material and the intermediate layer forming material, 206a and 206b, are arranged between vaporization crucibles 203 respectively charged with the light emission dopants 205a, 205b and 205c.

A method in which the dopant and the host material to be also used as the intermediate layer forming material are vaporized from the vapor sources arranged in parallel as shown in FIG. 8 is applicable as a more simple method.

The same layer constitution can be produced by moving (go and return in right and left directions) the substrate at a designated speed.

Such the method is also carried out by using the material capable of commonly applied for the host material and the intermediate layer forming material.

<<Intermediate Layer>>

The intermediate layer relating to the present invention is described below.

In the present invention, the intermediate layer is characterized in that the material for forming the intermediate layer is in common with the host compound contained in the light emission layer (the host compound is described later). Effects such as that the injection barrier between the light emission layer and the intermediate layer can be lowered and the injection balance of positive hole and electron can be easily held even when the applying voltage (current) is varied, can be obtained by commonly using the material of the light emission layer for the material of the intermediate layer. It is further found that the chromaticity deviation by applying voltage (electric current) can be improved. Moreover, the complexity of the production process of the element that is a serious problem on the production of the element having the intermediate layer can be solved by using the common material.

When many light emission layers are cyclically or randomly laminated as shown in FIGS. 10 to 13 and the host material is different from the intermediate layer, the production process is very complicated. Such the process can be considerably simplified by commonly using the same material according to the present invention.

Moreover, the triplet exciton in the light emission layer can be effectively confined in the light emission layer by using the material having triplet excitation energy higher than that of the phosphorescent compound and the element showing high efficiency can be obtained.

The Förster energy transfer between the light emission layers different from each other can be inhibited by setting the thickness of the intermediate layer to be larger than the Förster distance so that the chromaticity deviation can be inhibited and the element with high efficiency can be obtained.

As the material for forming such the intermediate layer and the host material (the host material is described later), known materials can be used. For the intermediate layer material and the host material, a material having the triplet excitation energy higher than that of the phosphorescent compounds having highest triplet excitation energy among the phosphorescent compounds is preferable. For example, in an element emitting white light composed of blue, green and red color light, when phosphorescent compounds are used for each of the color light emitting material, the triplet excitation energy of the blue light emitting compound is highest. The material for the intermediate layer and for host material larger than the blue light emitting compound in the triplet excitation energy is preferable.

In the organic EL element, the material for the intermediate layer and host material performs transportation of the carrier. Therefore, the material having carrier transport ability is preferable. Carrier mobility is used for expressing the carrier transportation ability, and the carrier transport ability of organic material is usually depended on the electric field strength. In the material having high electric field strength dependency, the balance of the injection and transportation of the positive hole and the electron tends to be lost. Accordingly, a material with low electric field dependency is preferably used as the material for the intermediate layer and host material.

Typical structure of the organic EL element is described below.

<<Layer Constitution of the Organic EL Element>>

Concrete examples of the layer constitution of the organic EL element of the present invention are described below but the present invention is not limited to them.

(i) Anode/Hole transport layer/Light emission layer/Hole blocking layer/Electron transport layer/Cathode (ii) Anode/Electron blocking layer/Light emission layer/Hole blocking layer/Electron transport layer/Cathode (iii) Anode/Hole transport layer/Electron blocking layer/Light emission layer/Hole blocking layer/Electron transport layer/Cathode (iv) Anode/Hole transport layer/Electron blocking layer/Light emission layer/Hole blocking layer/Electron transport layer/Cathode (v) Anode/Hole transport layer/Electron blocking layer/Light emission layer/Hole blocking layer/Electron transport layer/Cathode buffer layer/Cathode (vi) Anode/Anode buffer layer/Hole transport layer/Electron blocking layer/Light emission layer/Hole blocking layer/Electron transport layer/Cathode buffer layer/Cathode (vii) Anode/Anode buffer layer/Hole transport layer/Electron blocking layer/Light emission layer/Hole blocking layer/Electron transport layer/Cathode buffer layer/Cathode <<Blocking Layer (Electron Blocking Layer, Hole Blocking Layer)>>

The blocking layer relating to the present invention such as the electron blocking layer and the hole blocking layer is described below.

In the present invention, the material for the organic EL element of the present invention is preferably used to the hole blocking layer and the electron blocking layer and particularly preferably used to the hole blocking layer.

When the material of the organic EL element of the present invention is contained in the hole blocking layer or the electron blocking layer, the metal complex described in any one of claims 1 to 7 of the present invention may be contained in a content of 100% by weight or in a state of mixture with another organic compound such as the compound used in the layer constituting the organic EL element of the present invention.

The thickness of the blocking layer relating to the present invention is preferably from 3 nm to 100 nm and more preferably from 5 to 30 nm.

<<Hole Blocking Layer>>

The hole blocking layer has the function of the electron transport layer in a wide sense and is comprised of a material which has electron transport ability and very low hole transport ability. The probability of recombination of the electron with the hole can be raised by the ability of such the material of blocking the hole while transporting the electron.

The hole blocking layer described in, for example, JP-A Nos. 11-204258 and 11-204359, and "Yuuki EL soshi to sono kougyouka saizennsenn (organic EL element and its front of industrialization) Nov. 30, 1998 can be applied as the hole blocking layer relating to the present invention. Moreover, the later-mentioned electron transport layer relating to the present invention can be used as the hole blocking layer relating to the present invention according to necessity.

<<Electron Blocking Layer>>

The electron blocking layer comprises a material having a function of hole transportation in a wide sense while having very low ability of electron transportation. The probability of recombination of the electron with the hole can be raised by blocking the electron while transporting the hole. The constitution of the later-mentioned hole transport layer can be used as the electron blocking layer according to necessity.

In the present invention, the material of organic EL element of the present invention is preferably used in the layer adjacent to the light emission layer, namely the hole blocking layer or the electron blocking layer, particularly in the hole blocking layer.

<<Hole Transport Layer>>

The hole transport layer contains a material having the hole transport ability and includes in a wide sense a hole injection layer and the electron blocking layer. The hole transport layer may be provided singly or plurality.

The positive transportation material is not specifically limited and can be optionally selected from materials usually used as a charge injection material for hole and known materials used for the hole injection layer or the hole transport layer.

The material of the hole transport layer is one having ability of hole injection or transportation or ability of the electron barrier and may be an inorganic or organic substance. Examples of such the material include a triazole derivative, an oxadiazole derivative, an imidazole derivative, a polyarylalkane derivative, a pyrazoline derivative, a pyrazolone derivative, a phenylenediamine derivative, an arylamine derivative, an amino-substituted chalcone derivative, an oxazole derivative, a styrylanthracene derivative, a fluorenone derivative, a hydrazone derivative, a stilbene derivative, a silazane derivative, an aniline type copolymer and an electroconductive high molecular weight oligomer particularly a thiophene oligomer.

The above-mentioned can be used as the material of the hole transport layer, and a porphyline compound, an aromatic tertiary amine compound and a styrylamine compound particularly an aromatic tertiary amine compound are preferably used.

Typical examples of the aromatic tertiary amine compound and the styrylamine compound include N,N,N',N'-tetraphenyl-4,4'-diaminophenyl; N,N'-diphenyl-N,N'-bis(3-methylphenyl)-[1,1'-biphenyl]-4,4'-diamine (TPD); 2,2-bis(4-di-p-triaminophenyl)propane; 1,1-bis(4-di-p-triaminophenyl)-cyclohexane; bis(4-dimethylamino-2-methylphenyl)-phenylmethane; bis(4-di-p-triaminophenyl)phenylmethane; N,N'-diphenyl-N,N'-di(4-methoxyphenyl)-4,4'-diamonobiphenyl; N,N,N',N'-tetraphenyl-4,4'-diamonodiphenyl ether; 4,4'-bis(diphenylamino)quadriphenyl; N,N,N-tri(p-tolyl) amine; 4-(di-p-tolylamino)-4'-[4-(di-p-tolylamino-4'-[4-(di-p-tolylamino)styryl]stilbene; 4-N,N-diphenylamino-(2-diphenylvinyl)benzene; 3-methoxy-4'-N,N-diphenylaminostilbenzene; N-phenylcarbazole; ones having two condensed aromatic rings in the molecular thereof described in U.S. Pat. No. 5,061,569 such as 4,4-bis[N-(1-naphthyl)-N-phenylamino]biphenyl (NPD), and ones in which three triphenylamine units are bonded in star burst state described in JP-A No. 4-308688 such as [N-(3-methylphenyl)-N-phenylamino]triphenylamine (MTDATA).

Polymer materials can be also used, in which the above material is introduced in the main chain thereof or the main chain is formed by the above material.

Inorganic compounds such as p-type-Si, p-type SiC are also usable as the hole injection material or the hole transportation material. The hole transportation material preferably has high Tg.

The hole transport layer can be formed by making the above hole transportation material to a thin layer by a known method such as a vacuum vapor deposition method, a spin coat method, a casting method, an ink-jet method and a BL method. The thickness of the hole transport layer is usually approximately from 5 nm to 5,000 nm even though the thickness is not specifically limited. The hole transport layer may be a single layer comprising one or two or more kinds of the above material.

A highly p-type hole transport layer doped with an impurity also can be used. Examples of that are described in JP-A Nos. 4-297076, 2000-196140 and 2001-102175, and J. Appl. Phys., 95, 5773 (2004).

<<Electron Transport Layer>>

The electron transport layer comprises a material having electron transport ability and includes the electron injection layer and the hole blocking layer in a wide sense. The electron transport layer may be provided singly or plurality.

Hitherto, the following materials are used as the materials serving both of electron transportation and the hole blocking in the electron transport layer adjacent to the cathode side of the light emission layer when single or plural electron transport layers are provided.

The electron transport layer has a function of transporting the electron injected from the cathode to the light emission layer and the material thereof may be optionally selected from known compounds.

Examples of the material to be used in the electron transport layer, hereinafter referred to as electron transportation material, include a heterocyclic tetracarboxylic acid anhydride such as a nitro-substituted fluorene derivative, a diphenylquinone derivative, a thiopyrane dioxide derivative and naphthaleneperylene, carbodiimide, a fluorenylidenemethane derivative, a derivative of anthraquinonedimethane or anthrone and an oxadiazole derivative. Moreover, a thiadiazole derivative formed by substituting the oxygen atom in the above oxadiazole derivative and a quinoquizaline derivative having a quinoquizaline ring known as an electron withdrawing group are usable as the electron transportation material.

A polymer material in which the above material is introduced in the main chain thereof or forms the main chain thereof is constituted by the above material is also usable.

A metal complex of 8-quinolinol such as tris(8-quinolinol) aluminum (Aiq), tris(5,7-dichloro-8-quinolinol)aluminum, tris(5,7-dibromo-8-quinolinol)-aluminum, tris(2-methyl-8-quinolinol)aluminum, tris(5-methyl-8-quinolinol)aluminum, bis(8-quinolinol)zinc (Znq) and complexes of the above in which the center metal is replaced by In, Mg, Cu, Cs, Sn, Ca or Pb are usable as the electron transportation. Moreover, a metal free or metal-containing phthalocyanine and ones formed by substituting the terminal thereof by a substituent such as an alkyl group or a sulfonic acid group can be preferably used as the electron transportation material. The styrylpirazine derivatives exemplified as the material for the light emission layer are usable and inorganic semiconductors such as n-type Si and n-type SiC are also usable as the electron transportation material.

The electron transport layer can be formed by making the above electron transportation material into a thin layer by a known method such as vacuum vapor deposit method, a spin coating method, a casting method and a LB method. The thickness of the electron transport layer is usually about 5 to 5,000 nm tough the thickness is not specifically limited. The electron transport layer may be a single layer comprising one or two or more kinds of the above-mentioned materials.

A highly n-type hole transport layer doped with an impurity also can be used. Examples of that are described in JP-A Nos. 4-297076, 2000-196140, 2001-102175, and J. Appl. Phys., 95, 5773 (2004).

The injection layer to be used as a constitution layer of the organic EL element of the present invention is described below.

<<Injection Layer>>: Electron Injection Layer, Hole Injection Layer

The injection layer is classified into the electron injection layer and the hole injection layer, which are provided according to necessity. The injection layer may be provided between the anode and the light emission layer or hole transport layer, or between the cathode and the light emission layer or electron transport layer.

The injection layer is a layer provided between the electrode and the organic layer for lowering the driving voltage or raising the luminance of emitted light. The injection layer is described in detail in "Yuuki EL soshi to sono kougyouka saizennsenn (Organic EL element and its Front of Industrialization) Vol. 2, Sect. 2, "Electrode materials" pp. 123 to 166, Nov. 30, 1998, published by NTS Co., Ltd., and includes a hole injection layer (an anode buffer layer) and an electron injection layer (a cathode buffer layer).

The anode buffer layer (hole injection layer) is described in detail in JP-A Nos. 9-45479, 9-260062 and 8-288069, and concrete examples thereof include a phthalocyanine buffer layer typically copper phthalocyanine, an oxide buffer layer typically vanadium oxide, an amorphous carbon buffer layer and a polymer buffer layer using polyaniline (emeraldine) or polythiophene.

The cathode buffer layer (electron injection layer) is also described in detail in JP-A Nos. 6-325871, 9-17574 and 10-74586, and examples thereof include a metal buffer layer typically strontium and aluminum, an alkali metal compound buffer layer typically lithium fluoride, an alkali-earth metal compound buffer layer typically magnesium fluoride and an oxide buffer layer typically aluminum oxide.

The buffer layer (injection layer) is desirably an extremely thin layer and the thickness thereof is preferably from 5 to 5,000 nm in accordance with the kind of the material. The injection layer is may have a single layer structure comprising one or two or more kinds of the material.

<<Anode>>

The anode relating to the organic EL element of the present invention is preferably one comprising a metal, an alloy, an electroconductive compound or a mixture of them each having high work function (not less than 4 eV) is preferable. Examples of such the electrode material include a metal such as Au and an electroconductive transparent material such as CuI, indium tin oxide (ITO), $SnO_2$, and ZnO. An amorphous material capable of forming a transparent electrode layer such as IDIXO ($In_2O_3$—Zn) is usable. The anode may be formed by making a thin layer of such the electrode material by a method such as a vapor deposition or a spattering method and patterning to the desired form by a photolithographic method. The vapor deposition or spattering of the electrode material may be performed through a mask of desired pattern to form the pattern of the electrode when the high precision is not so necessary. When the light is putout through the anode, the transparency of the anode is preferably not less than 10% and the sheet resistivity is preferably not more than several hundred $\Omega/\square$. The layer thickness is usually from 10 nm to 1,000 nm and preferably from 10 nm to 200 nm.

<<Cathode>>

On the other hand, as the cathode relating to the present invention, one comprising a metal (referred to as an electron injective metal), an ally, an electroconductive compound each having low working function (not more than 4 eV) or a mixture thereof is used. Concrete examples of such the electrode material include sodium, sodium-potassium alloy, magnesium, lithium, a magnesium/copper mixture, a magnesium/silver mixture, a magnesium/aluminum mixture, a magnesium/indium mixture, an aluminum/aluminum oxide ($Al_2O_3$) mixture, indium, a lithium/aluminum mixture, and a rare-earth metal. Among them, a mixture of an electron injective metal and a second metal larger in the working function and stability than the electron injective metal such as the magnesium/silver mixture, magnesium/indium mixture, aluminum/aluminum oxide ($Al_2O_3$) mixture, lithium/aluminum mixture and aluminum are suitable from the viewpoint of the electron injecting ability and the stability against oxidation. The cathode can be formed by making such the electrode material into a thin layer by a method such as a vapor deposition method or a spattering method. The sheet resistivity of the cathode is preferably not more than several hundred $\Omega/\square$ and the thickness thereof is usually selected within the range of from 10 nm to 1,000 nm and preferably from 50 nm to 200 nm. It is suitable that at least one of the anode and cathode is transparent or semitransparent for raising the luminance of the emitted light.

<<Substrate (Also Referred to as Base Plate, Base Material or Support)>>

There is no limitation on the kind of substrate such as glass and plastics relating to the organic EL element of the present invention as long as that is transparent, and glass, quartz and light permeable resin film can be cited as the preferably usable material. Particularly preferable substrate is the resin film which can give flexibility to the organic EL element.

As the resin film, for example, a film comprising polyethylene terephthalate (PET), polyethylene naphthalate PEN), polyether sulfone (PES), polyetherimide, poly(ether ether ketone), poly(phenylene sulfide), polyallylate, polyimide, polycarbonate (PC), cellulose triacetate (TAC) or cellulose acetate propionate can be cited.

A layer of inorganic substance or an organic substance or a hybrid layer of them may be formed on the surface of the resin film, and the film is preferably one having high barrier ability of a steam permeability of not more than 0.01 $g/m^2 \cdot day \cdot atm$.

The output efficiency at room temperature of emitted light of the organic EL is preferably not less than 1% and more preferably not less than 2%, wherein the output efficiency is expressed by the following expression: External Quantum Efficiency (%)=Number of photon emitted from organic EL element to exterior/Number of electron applied to organic EL element×100.

A hue improvement filter such as a color filter may be used with together.

A film having roughened surface such as an anti-glaring film also can be used for reducing the unevenness of light emission when the element is used for lighting.

When the element is used for a multi-color display, the apparatus has at least two kinds of organic EL elements having different emission peak wavelengths from each other. A suitable example of production of the organic EL is described below.

<<Production Method of Organic EL Element>>

As an example of production method of the organic EL element of the present invention having the constitution of Anode/Hole injection layer/Hole transport layer/Light emission layer/Hole blocking layer/Electron transport layer/Cathode buffer layer/Cathode is described below.

On a suitable substrate, a thin layer of a desired electrode material such as the anode material is formed by a method such as vapor deposition or spattering so that the layer thickness is preferably within the range of from 10 nm to 200 nm to form an anode. On the anode, thin layers such as the hole injection layer, the hole transport layer, the light emission layer, the hole blocking layer are formed.

As the method for forming the thin layer containing the organic compound, the spin coating method, casting method, ink-jet method, vapor deposition method and printing method are applicable, and the vacuum vapor deposition method and spin coating method are particularly preferable from the viewpoint of that uniform layer can be easily formed and pin-hole is difficulty formed and different layer forming methods may be applied for each of the layers, respectively. When the thin layers are formed by the vapor deposition method, it is desirable that the deposition conditions are suitably selected from the range of boat heating temperature of from 50° C. to 450° C., vacuum degree of from $10^{-6}$ Pa to $10^{-2}$ Pa, a deposition rate of from 0.01 nm to 50 nm/second, a substrate temperature of from −50° C. to 300° C. and a layer thickness of from 0.1 nm to 5 μm.

After formation of these layers, the cathode is provided on the layer by a method such as the vapor deposition and spattering so the thickness becomes not more than 1 μm and preferably from 50 nm to 200 nm to obtain the desired organic EL element. It is preferably that the formation of the hole injection layer to the cathodes is consistently performed by once evacuation but it is allowed that the element is take out on half way for subjecting to a different layer formation procedure. In such the case, it is necessary to consider that the operation is carried out under an inert gas atmosphere.

<<Display>>

The display is described below.

Though the display of the present invention may be mono-color or multi-color display, the multi-color display is described here. In the case of the multi-color display, a shadow mask is only applied at the formation of light emission layer and the other layers can be uniformly formed by the vapor deposition method, casting method, spin coating method, ink-jet method or printing method.

When the light emission layer is only patterned, the patterning by the vapor deposition method, ink-jet method or printing method is preferable, though the method is not specifically limited.

The order of layer formation may be reversed so that the order becomes the cathode, electron transport layer, hole blocking layer, light emission layer, hole transport layer and anode.

Light emission can be observed when a DC voltage of from about 2 to 40 V is applied to the element so that the polarity of the anode is positive and that of the cathode is negative. If the polarity is reversed, the electric current is not caused and light is not emitted at all. When AC voltage is applied, light is emitted only at the time when the anode is positive and cathode is negative. The wave shape of the AC voltage to be applied may be optional.

The multi-color display can be applied as a displaying device, a display and various lighting sources. In the displaying device and display, full color image can be displayed by the use of three kinds of organic EL elements emitting blue, green and red light.

Examples of the displaying device and display are a television, a personal computer, a mobile apparatus, an AV apparatus, display for letter broad casting and a display attached in car. The apparatus may be used for reproducing a still image and a moving image. When the apparatus is used for displaying the moving image, both of a simple matrix (passive matrix) system and an active matrix system may be either applied.

As the lighting source, the element can be applied for domestic lighting, car lighting, backlight for a watch or liquid crystal display, light for a sign board, a signal light, light source for a light memory medium, light source of an electrophotographic copy machine, light source of a light communication apparatus and light source for a photo-sensor but the use is not limited to the above.

<<Illuminator>>

The illuminator according to the present invention is described below.

The organic EL element of the present invention may be used as an organic EL element having a resonator structure therein. Such the organic EL element having resonator structure can be used as, for example, a light source of light memory medium, a light source of electrophotographic copying machine, a light source of light communication apparatus and a light source for light sensor but the use of that is not limited to the above-mentioned. The element can be used for the above-mentioned use by oscillating a laser.

The organic EL element of the present invention may be used as a kind of lamp such as the lighting light source and the exposing light source and as a projection apparatus for projecting an image or a display for directly watching a still or a moving image. The driving system for displaying the moving image may be either a simple matrix (passive matrix) system or an active matrix system. A full color display can be produced by using two or more kinds of the organic EL element of the present invention each different from each other in the color of emitting light.

An example of the display having the organic EL element of the present invention is described below referring drawings.

FIG. 1 shows a schematic drawing of an example of display constituted by the organic EL element. The schematic drawing shows an apparatus for displaying image information by emitted light by the organic EL element such as a display of a portable telephone.

Display 1 comprises a display A having plural pixels and a controlling device B for scanning the display 1 according to image information.

The controlling device B electrically connected with the display A sends scanning signals and image data to each of the plural pixels according to image information sent from outside. The pixels of each of the scanning line successively emit light by the scanning signals each corresponding to image date signals to display the image information on the display A.

Figure 2:
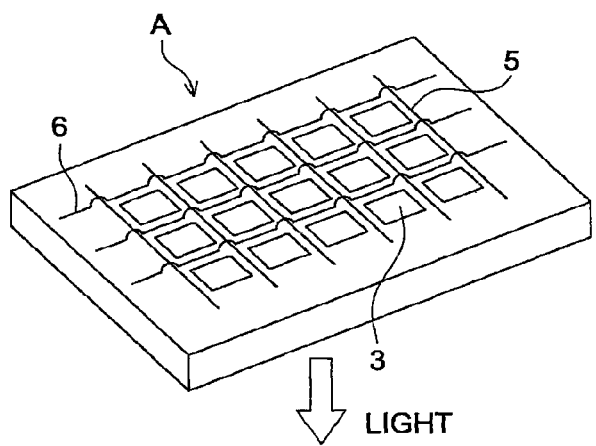
FIG. 2 shows a schematic drawing of display A.

FIG. 2 shows schematic drawing of the display A.

The display A has wiring including plural lines for scanning 5 and that for data 6 and plural pixels 3 on a substrate. Principal parts of the display A are described below.

In the drawing, light emitted from the pixel 3 is taken out in the direction of the white arrow (downward).

The scanning lines 5 and the data lines 6 are each composed of an electroconductive material and the scanning line and the date line are crossed in lattice form at a right angle as a lattice and connected to the pixel 3 at the crossing point (detail of that is not shown in the drawing).

The pixel 3 receives image data from the date line 6 when the scanning signal is applied from the scanning line 5 and emits light corresponding to the image data. Full color image can be displayed by arranging pixels emitting red range light, green range light and blue range light on the same substrate.

When white light emitting organic EL elements are used, full color display can be performed by using B, G and R color filters.

The light emitting process of the pixel is described below.

Figure 3:
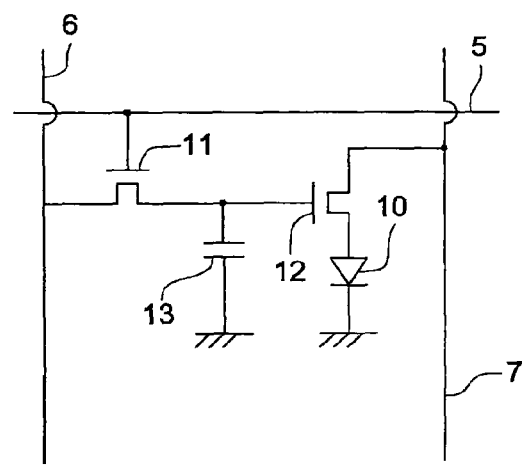
FIG. 3 shows an equivalent circuit drawing of a driving circuit constituting a pixel.

FIG. 3 shows a schematic drawing of the pixel.

The pixel has the organic EL element 10, a switching transistor 11 and a driving transistor 12 and a condenser 13. Full color display can be realized by using the white light emitting organic EL element divided into plural pixels combined with B, G and R color filters.

In FIG. 3, the switching transistor is turned ON when the date signals are applied to the drain of the switching transistor from the controlling device B through the data line 6 and the scanning signals are applied to the gate of the switching transistor 11 from the controlling device B through the scanning line 5 so that the date signal applied to the drain is transferred to the condenser 13 and the gate of the driving transistor 12.

The condenser 13 is charged according to the potential of the image data and the driving of the driving transistor 12 is turned ON by the transfer of the image data signal. The drain of the driving transistor is connected to the power source line 7 and the source of that is connected to the electrode of the organic EL element 10. Electric current is supplied from the power source line 7 to the organic EL element 10 corresponding to the potential of the image data signal applied to the gate.

The driving of the switching transistor 11 is turned OFF when the scanning signal is moved to the next scanning line 5 by the successive scanning by the controlling device B. However, the light emission by the organic EL element 10 is continued until next scanning signal is applied since the driving of the driving condenser is kept at ON state even when the switching transistor is turned OFF because the condenser 13 holds the charged potential. When the next scanning signal is applied by the successive scanning, the driving transistor 12 is driven corresponding to the potential of the image data signals synchronized with the scanning signals and the organic EL element 10.

The organic EL element 10 of each of the plural pixels 3 emits light by providing the switching transistor 11 as an active element and the driving transistor 12 to the organic EL element 10 of each of the plural pixels. Such the light emission system is called as the active matrix system.

The light emission of the organic EL element 10 may be light emission with gradation corresponding to multi-value data signal having plural gradation potentials or on-off of the designated light amount according to the bi-value image data signal.

The potential of the condenser 13 may be held until application of the next scanning signal or discharged just before the application of the next scanning signal.

In the present invention, the light emission may be preformed according to the passive matrix system, not limited to the active matrix system, in which the light is emitted according to the data signal only when the scanning signal is supplied.

FIG. 4 shows a schematic drawing of a display by the passive matrix system. In FIG. 4, plural scanning lines 5 and the plural image data lines 6 are separately provided on both sides of the pixel 3 so as to face to each other for forming lattice state.

When the scanning signal is applied to the scanning line 5 by successive scanning, the pixel 4 connected to the scanning line to which the signal is applied emits light corresponding to the image data signal. In the passive matrix system, any active element is not necessary and the production cost can be reduced.

The materials of the organic EL element relating to the present invention can be applied for an organic EL element emitting substantial white light as an illuminator. The white light is obtained by mixing plural color light simultaneously emitted by plural light emission materials. The combination of the plural color light may be a combination containing three maximum wavelengths of the three primary colors of blue, green and red or a combination containing two maximum wave length of blue and yellow or complementary colors such as blue and yellow or bluish green and orange.

The combination of the light emission materials for obtaining the plural colors light may be a combination of plural materials capable of emitting phosphorescent light or fluorescent light (fluorescence dopant) or a combination of the material capable of emitting fluorescent or phosphorescent light and a dye capable of emitting light by excitation by the light emitted from the above light emitting material. In the white light emitting organic electro luminescent element, the combination of plural kinds of the light emitting dopant is preferable.

As the layer constitution of the organic electroluminescent element, a method in which the plural kinds of dopant are contained in one light emission layer, a method in which the element has plural light emission layers and the dopants different from each other in the wavelength of the emitting light are each contained in each of the layers, respectively, and a method in which fine pixels each emitting different wavelength light are formed in a matrix state are cited.

In the white light emitting organic electroluminescent element relating to the present invention, patterning may be carried out according to necessity by a metal mask or an ink-jet printing method. The patterning treatment may be given only to the electrode, to the electrode and the light emitting layer or to the entire layers of the element.

The light emission material to be used in the light emission layer is not specifically limited. For instance, in the case of the backlight for the liquid crystal displaying element, it is allowed that the materials optionally selected from the platinum complexes relating to the present invention and known light emission materials are combined so that the emitted white light is suited to the wavelength range corresponding to the property of the color filter.

As above-described, the white light emitting organic EL element of the present invention can be usefully applied for domestic lighting and car room lighting as various kinds of light source and illuminators, and for a light source for exposing as a kind of lamp, and for displays such as the backlight of the liquid crystal display additionally to the displaying device and the display.

Additionally to the above, various use can be cited such as a backlight of watch, an advertising signboard, a signal, a light source for light memory media, a light source for electrophotographic copier, a light source for light communication apparatuses, a light source for light sensors and a domestic electric apparatuses having displaying means.

EXAMPLES

The present invention is described below referring examples but the present invention is not limited thereto.

Structures of the compounds used in the examples are shown below.

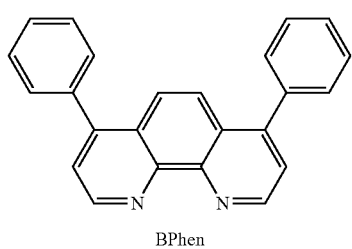
BPhen

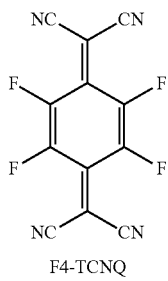
F4-TCNQ

Example 1

Preparation of Organic EL Element 1-1

A layer of ITO (indium oxide) having a thickness of 100 nm formed on a glass substrate plate of 100 mm×100 mm×1.1 mm (NA45 manufactured by NH Technoglass Co., Ltd.), was subjected to a patterning treatment to prepare an anode. The transparent substrate plate carrying the ITO transparent electrode was washed by ultrasonic wave using isopropyl alcohol, dried by dried nitrogen gas and cleaned by UV-ozone cleaning for 5 minutes. The resultant transparent substrate was fixed on a substrate holder of a vacuum vapor deposition apparatus available on the market. The crucibles in the vapor deposition apparatus were arranged as shown in FIG. 7. Concretely, light emission Dopants Ir-12 and Ir-9 were each charged into the vapor deposition crucibles 204a and 204b, respectively, and CDBP as the host material and the intermediate layer forming material was charged into the crucible 204d each in a suitable amount. The vaporizing crucibles made from a molybdenum resistance heating material were used.

Vaporizing crucibles respectively charged with NPD, HTM1, H-13 and Alq$_3$ were separately set which were not shown in the drawing.

Then the pressure in the vacuum chamber was reduced to $4 \times 10^{-4}$ Pa and the vaporization crucible containing NPD was heated by applying electric current for depositing NPD on the transparent substrate in a depositing rate of 0.1 nm/second to form a hole transport layer of 25 nm.

Next, the vaporization crucible containing HTM1 was heated by applying electric current for depositing HTM1 on the transparent substrate in a depositing rate of 0.1 nm/second to form a hole transport layer of 15 nm.

After that, light emission layer A, an intermediate layer and light emission layer B were formed using the materials shown in Tables 1 and 2 and then a layer of Compound H-13 of 10 m was deposited as a hole blocking layer on light emission layer B.

Moreover, an electron transport layer of 30 nm was deposited at a rate of 0.1 nm/second by applying electric current to the crucible containing Alq$_3$.

The temperature of the substrate was controlled so as to be room temperature.

After that, 0.5 nm of lithium fluoride layer was deposited as a cathode buffer layer and then 110 nm of aluminum layer as the cathode was deposited to prepare Organic EL Element 1-1.

<<Preparation of Organic EL Elements 1-2 to 1-12>>

Organic EL Elements 1-2 to 1-1 were prepared in the same manner as in Organic EL Element 1-1 except that the constitution of the light emission layer (light emission layer and the intermediate layer) was changed as shown in Tables 1 and 2.

TABLE 1

| Element No. | * constitution | * A | * B | * C | Remarks |
|---|---|---|---|---|---|
| 1-1 | * 1-1 | H-14: Ir-12 3 ** 15 nm | H-14: Ir-9 8 ** 8 nm | None | Inv. |
| 1-2 | * 1-4 | H-6: Ir-12 3 ** 7 nm | H-6: Ir-9 8 ** 5 nm | None | Inv. |
| 1-3 | * 1-6 | H-13: Ir-12 3 ** 3 nm | H-13: Ir-9 8 ** 2 nm | None | Inv. |
| 1-4 | * 2-2 | H-14: Ir-13 3 ** 8 nm | H-14: Ir-1 6 ** 4 nm | H-14: Ir-9 8 ** 6 nm | Inv. |
| 1-5 | * 2-5 | H-13: Ir-13 3 ** 6 nm | H-13: Ir-9 8 ** 2 nm | H-13: Ir-1 6 ** 4 nm | Inv. |
| 1-6 | * 2-6 | H-14: Ir-13 3 ** 5 nm | H-14: Ir-1 6 ** 2 nm | H-14: Ir-9 8 ** 3 nm | Inv. |
| 1-7 | * 2-7 | H-13: Ir-13 3 ** 4 nm | H-13: Ir-1 6 ** 1.5 nm | H-13: Ir-14 6 ** 2 nm | Inv. |
| 1-8 | * 3-4 | H-14: Ir-13 6 ** 5 nm | H-14: Ir-9 7 ** 3 nm | H-14: Ir-5 7 ** 2 nm | Inv. |
| 1-9 | * 2-6 | H-14: TPB 3 ** 5 nm | H-14: Ir-1 6 ** 2 nm | H-14: Ir-9 8 ** 3 nm | Inv. |
| 1-10 | * 1-1 | H-15: Ir-12 3 ** 15 nm | H-15: Ir-9 8 ** 8 nm | None | Comp. |
| 1-11 | * 1-1 | H-14: Ir-12 3 ** 15 nm | H-14: Ir-9 8 ** 8 nm | None | Comp. |
| 1-12 | * 2-6 | H-14: Ir-13 3 ** 5 nm | H-14: Ir-1 6 ** 2 nm | H-14: Ir-9 8 ** 3 nm | Comp. |
| 1-13 | * 1-1 | Ir-14: H-16 11 ** 5 nm | H-16: D-49 9 ** 15 nm | None | Inv. |
| 1-14 | * 2-1 | H-16: D-1 9 ** 15 nm | Ir-1: H-16 6 ** 2 nm | Ir-14: H-16 11** 5 nm | Inv. |

* Light emission layer,
** weight-%,
Inv. Inventive,
Comp. Comparative

TABLE 2

| Element No. | *constitution | *D | Intermediate layer | Remarks |
|---|---|---|---|---|
| 1-1 | *1-1 | None | H-14 3 nm | Inventive |
| 1-2 | *1-4 | None | H-6 all 3 nm | Inventive |
| 1-3 | *1-6 | None | H-13 entirely 3 nm | Inventive |
| 1-4 | *2-2 | None | H-14 between light emission layers A-C 3 nm | Inventive |
| 1-5 | *2-5 | None | H-13 all 3 nm | Inventive |
| 1-6 | *2-6 | None | H-14 all 3 nm | Inventive |
| 1-7 | *2-7 | None | H-13 all 3 nm | Inventive |
| 1-8 | *3-4 | H-14:Ir-10 6 weight-% 2 nm | H-14 all 3 nm | Inventive |
| 1-9 | *2-6 | None | H-14 all 3 nm | Inventive |
| 1-10 | *1-1 | None | BAlq 3 nm | Comparative |
| 1-11 | *1-1 | None | BAlq 3 nm | Comparative |
| 1-12 | *2-6 | None | BAlq all 3 nm | Comparative |
| 1-13 | *1-1 | None | H-16 9 3 nm | Inventive |
| 1-14 | *2-1 | None | H-16 9 3 nm | Inventive |

*Light emission layer

The external quantum efficiency and the chromaticity deviation of each of Organic EL elements 1-1 to 1-12 were evaluated as follows.

<<External Quantum Efficiency>>

The external quantum efficiency in percent of each of the organic El elements was measured by constantly applying an electric current of 2.5 A/cm² to the element at 23° C. under an atmosphere of nitrogen gas. A spectral irradiance meter CS-1000 manufactured by Minolta Co., Ltd. was used for measurement.

<<Evaluation of Chromaticity Deviation>>

The deviation of chromaticity is expressed by difference between the chromaticity at a luminance of 100 and that at 5,000 cd/m² in CIE chromaticity diagrams. The measurement was carried out at 23° C. by CS-1000 manufactured by Minolta Co., Ltd., under nitrogen gas atmosphere.

Thus obtained results are shown in Table 3.

TABLE 3

| Element No. | External quantum efficiency | Chromaticity deviation | Remarks |
|---|---|---|---|
| 1-1 | 170 | 0.01 | Inventive |
| 1-2 | 140 | 0.008 | Inventive |
| 1-3 | 150 | 0.004 | Inventive |
| 1-4 | 160 | 0.01 | Inventive |
| 1-5 | 145 | 0.008 | Inventive |
| 1-6 | 160 | 0.006 | Inventive |
| 1-7 | 145 | 0.005 | Inventive |
| 1-8 | 165 | 0.01 | Inventive |
| 1-9 | 135 | 0.007 | Inventive |
| 1-10 | 100 | 0.03 | Comparative |
| 1-11 | 115 | 0.04 | Comparative |
| 1-12 | 80 | 0.02 | Comparative |
| 1-13 | 172 | 0.008 | Inventive |
| 1-14 | 175 | 0.008 | Inventive |

It is clear from Table 3 that the elements of the present invention show high external quantum efficiency namely high light emission efficiency and small chromaticity deviation.

Example 2

Preparation of Organic EL Element 2-1 to 2-12

Organic EL Elements 2-1 to 2-12 were each prepared in the same manner as in Organic EL Elements 1-2 to 1-12, respectively, except that NPD was replaced with a co-deposited layer of HTM1 and F4-TCQ$_3$ in a ratio of 97:3 and Alq$_3$ was replaced with a co-deposited layer of BPhen and Ca in a ratio of 1:1 and deposition layer of LiF was omitted. It was confirmed that the driving voltage of Organic EL Elements 2-1 to 2-12 can be lowered by 3 to 6 V compared with Organic EL Elements 1-1 to 1-12.

From the above-mentioned, it was confirmed that the elements having high energy efficiency (1 m/W) can be obtained by the present invention.

Example 3

The non-light emission surface of Organic EL element 1-6 was covered with a glass sealing can to prepare an illuminator. The illuminator could be used as a thin shaped illuminator capable of emitting white light which had high light emission efficiency and long lifetime. FIG. 6 is a schematic drawing of the illuminator, and (a) is a plan view and (b) is a cross section of the illuminator. The organic EL layer 102 provided on the glass substrate with the electrode 101 was covered by a glass sealing can 104; a UV curable adhesive 107 was used for adhering the glass sealing can. The sign 103 indicates the cathode. The interior of the glass sealing can 104 was filled by nitrogen gas and a moisture catching agent 105 was provided.

INDUSTRIAL APPLICABILITY

The organic electroluminescent element, display and illuminator can be provided by the present invention, which displays high external quantum efficiency namely high in the light emission efficiency and low in the deviation of chromaticity.

What is claimed is:

1. A method of producing an organic electro luminescent element comprising:
    (i) forming a transparent electrode as an anode on a transparent substrate;
    (ii) forming a light emission layer on the transparent substrate having thereon the anode; and
    (iii) forming a cathode on the substrate having thereon the anode and the light emission layer;
    wherein the light emission layer is formed by a method comprising:
    (iv) arranging at least two vaporization crucibles E each evaporating a different light emission dopant from each other and at least one vaporization crucible I evaporating a host material and an intermediate layer forming material; and
    (v) moving the substrate having thereon the anode over the vaporization crucibles E and I to form a light emission layer;
    wherein at least two vaporization crucibles E each evaporate a different phosphorescent dopant from each other.

2. The method of claim 1, wherein three or more evaporation crucibles E are arranged, wherein at least three evaporation crucibles E each evaporate a different light emission dopant from each other, wherein at least two vaporization crucibles E each evaporate a different phosphorescent light emission dopant from each other.

3. The method of claim 2, wherein an evaporation crucible I evaporating a host material and an intermediate layer forming material is arranged between each of at least two pairs of evaporation crucibles E.

4. The method of claim 1, wherein four or more evaporation crucibles E are arranged, wherein at least four evaporation crucibles E each evaporate a different light emission dopant from each other, wherein at least two vaporization crucibles E each evaporate a different phosphorescent light emission dopant from each other.

5. The method of claim 4, wherein an evaporation crucible I evaporating a host material and an intermediate layer forming material is arranged between each of at least three pairs of evaporation crucibles E.

6. The method of claim 1, wherein at least one of the following is performed between steps (i) and (ii):
    (vi) forming a hole transport layer; and
    (vii) forming an electron blocking layer.

7. The method of claim 1, wherein at least one of the following is performed between steps (ii) and (iii):
    (viii) forming a hole blocking layer;
    (ix) forming an electron transport layer; and
    (x) forming a cathode buffer layer.

* * * * *